United States Patent
Jeong et al.

(10) Patent No.: US 10,035,883 B2
(45) Date of Patent: Jul. 31, 2018

(54) LAMINATE, AND ELEMENT COMPRISING SUBSTRATE MANUFACTURED USING SAME

(71) Applicant: LG CHEM, LTD., Seoul (KR)

(72) Inventors: Hye Won Jeong, Daejeon (KR); Kyungjun Kim, Daejeon (KR); Kyoung Hoon Kim, Daejeon (KR); Chan Hyo Park, Daejeon (KR); BoRa Shin, Daejeon (KR); Seung Yup Lee, Daejeon (KR); HangAh Park, Daejeon (KR); JinHo Lee, Daejeon (KR); MiRa Im, Daejeon (KR)

(73) Assignee: LG CHEM, LTD., Seoul (KR)

( * ) Notice: Subject to any disclaimer, the term of this patent is extended or adjusted under 35 U.S.C. 154(b) by 306 days.

(21) Appl. No.: 14/422,495

(22) PCT Filed: Apr. 8, 2014

(86) PCT No.: PCT/KR2014/003044
§ 371 (c)(1),
(2) Date: Feb. 19, 2015

(87) PCT Pub. No.: WO2014/168402
PCT Pub. Date: Oct. 16, 2014

(65) Prior Publication Data
US 2015/0210048 A1 Jul. 30, 2015

(30) Foreign Application Priority Data

Apr. 9, 2013 (KR) .................. 10-2013-0038581
Apr. 7, 2014 (KR) .................. 10-2014-0041567
(Continued)

(51) Int. Cl.
*B32B 27/28* (2006.01)
*B32B 7/02* (2006.01)
(Continued)

(52) U.S. Cl.
CPC ............ *C08G 73/1067* (2013.01); *B32B 3/16* (2013.01); *B32B 7/02* (2013.01); *B32B 7/06* (2013.01);
(Continued)

(58) Field of Classification Search
CPC .... B32B 7/02; B32B 7/06; B32B 7/12; B32B 27/08; B32B 27/281; B32B 27/286;
(Continued)

(56) References Cited

U.S. PATENT DOCUMENTS 5,427,848 A * 6/1995 Baer ...................... B32B 15/08
427/520
5,858,518 A 1/1999 Omote et al.
(Continued)

FOREIGN PATENT DOCUMENTS

CN  1527763 A  9/2004
CN  1284425 C  11/2006
(Continued)

OTHER PUBLICATIONS

Machine Translation of JP11-012465. Retrieved Mar. 23, 2017.*
(Continued)

*Primary Examiner* — Prashant J Khatri
(74) *Attorney, Agent, or Firm* — Rothwell, Figg, Ernst & Manbeck, P.C.

(57) ABSTRACT

The present invention relates to a laminate and a device fabricated using the laminate. The laminate includes a first polyimide resin layer between a carrier substrate and a second polyimide resin layer, wherein the first polyimide resin layer has a coefficient of thermal expansion (CTE) equal to or lower than the CTE of the second polyimide-based resin layer at a temperature of 100 to 200° C., and the adhesive strength of the first resin layer to the second resin layer decreases when a physical stimulus causing no chemi-
(Continued)

cal changes in the first resin layer is applied to the laminate. According to the present invention, the flexible substrate can be easily separated from the carrier substrate without the need for further processing such as laser or light irradiation. Therefore, the use of the laminate facilitates the fabrication of the device having the flexible substrate. The device may be, for example, a flexible display device. In addition, the device can be prevented from deterioration of reliability and occurrence of defects caused by laser or light irradiation. This ensures improved characteristics and high reliability of the device.

22 Claims, 5 Drawing Sheets

(30) Foreign Application Priority Data

| Apr. 7, 2014 | (KR) | 10-2014-0041568 |
| Apr. 7, 2014 | (KR) | 10-2014-0041570 |
| Apr. 7, 2014 | (KR) | 10-2014-0041571 |
| Apr. 7, 2014 | (KR) | 10-2014-0041572 |
| Apr. 7, 2014 | (KR) | 10-2014-0041573 |
| Apr. 7, 2014 | (KR) | 10-2014-0041574 |

(51) Int. Cl.

| C08G 73/10 | (2006.01) |
| B32B 7/06 | (2006.01) |
| B32B 7/12 | (2006.01) |
| B32B 27/08 | (2006.01) |
| B32B 27/30 | (2006.01) |
| B32B 27/36 | (2006.01) |
| B32B 3/16 | (2006.01) |
| B32B 43/00 | (2006.01) |
| B32B 27/06 | (2006.01) |
| C03C 17/34 | (2006.01) |
| B32B 17/06 | (2006.01) |
| B32B 37/26 | (2006.01) |
| H01L 31/02 | (2006.01) |
| H01L 31/18 | (2006.01) |
| H01L 51/00 | (2006.01) |
| H01L 51/52 | (2006.01) |
| H01L 51/56 | (2006.01) |

(52) U.S. Cl.
CPC .............. *B32B 7/12* (2013.01); *B32B 17/064* (2013.01); *B32B 27/06* (2013.01); *B32B 27/08* (2013.01); *B32B 27/281* (2013.01); *B32B 27/286* (2013.01); *B32B 27/308* (2013.01); *B32B 27/36* (2013.01); *B32B 37/26* (2013.01); *B32B 43/006* (2013.01); *C03C 17/3405* (2013.01); *H01L 31/02* (2013.01); *H01L 31/18* (2013.01); *H01L 51/0024* (2013.01); *H01L 51/0097* (2013.01); *H01L 51/52* (2013.01); *H01L 51/56* (2013.01); *B32B 2037/268* (2013.01); *B32B 2250/02* (2013.01); *B32B 2250/03* (2013.01); *B32B 2255/26* (2013.01); *B32B 2307/30* (2013.01); *B32B 2307/402* (2013.01); *B32B 2307/412* (2013.01); *B32B 2307/748* (2013.01); *B32B 2379/08* (2013.01); *B32B 2457/00* (2013.01); *B32B 2457/20* (2013.01); *B32B 2457/202* (2013.01); *B32B 2457/206* (2013.01); *C03C 2218/355* (2013.01); *H01L 2227/326* (2013.01); *H01L 2251/5338* (2013.01); *Y10T 156/1195* (2015.01); *Y10T 428/24942* (2015.01); *Y10T 428/265* (2015.01); *Y10T 428/31507* (2015.04); *Y10T 428/31533* (2015.04); *Y10T 428/31623* (2015.04); *Y10T 428/31681* (2015.04); *Y10T 428/31721* (2015.04); *Y10T 428/31736* (2015.04)

(58) Field of Classification Search
CPC ....... B32B 27/308; B32B 27/36; B32B 27/06; B32B 3/16
See application file for complete search history.

(56) References Cited

U.S. PATENT DOCUMENTS

| 6,096,482 | A | 8/2000 | Omote et al. |
| 6,100,582 | A | 8/2000 | Omote et al. |
| 7,338,716 | B2 | 3/2008 | Okamura et al. |
| 8,034,460 | B2 | 10/2011 | Kim et al. |
| 2004/0048445 | A1 | 3/2004 | Chason et al. |
| 2004/0260053 | A1 | 12/2004 | Yen-Huey et al. |
| 2006/0078671 | A1 | 4/2006 | Lee et al. |
| 2011/0033682 | A1* | 2/2011 | Shimizu ................. B32B 15/08 428/213 |
| 2012/0001534 | A1 | 1/2012 | Kim |
| 2012/0228617 | A1 | 9/2012 | Ko et al. |
| 2013/0161864 | A1 | 6/2013 | Liang et al. |
| 2014/0041800 | A1* | 2/2014 | Okuyama ........... B29C 65/1432 156/247 |

FOREIGN PATENT DOCUMENTS

| CN | 101132911 A | 2/2008 | |
| CN | 101138898 A | 3/2008 | |
| CN | 102408564 A | 4/2012 | |
| EP | 2 849 241 A1 | 3/2015 | |
| JP | H10-12984 A | 1/1998 | |
| JP | 11012465 A * | 1/1999 | |
| JP | 2007-203505 A | 8/2007 | |
| JP | 2010-141126 A | 6/2010 | |
| JP | 2010-157571 A | 7/2010 | |
| JP | 2010-201625 A | 9/2010 | |
| JP | 2011-20399 A | 2/2011 | |
| JP | 2011-020399 A | 2/2011 | |
| JP | 2012-189974 A | 10/2012 | |
| KR | 10-2008-0041855 A | 5/2008 | |
| KR | 10-2008-0113375 A | 12/2008 | |
| KR | 10-2009-0004767 A | 1/2009 | |
| KR | 10-2012-0003664 A | 1/2012 | |
| WO | 00/66507 A1 | 11/2000 | |
| WO | WO 2012141248 A1 * | 10/2012 | ......... B29C 65/1432 |
| WO | 2014/050933 A1 | 4/2014 | |

OTHER PUBLICATIONS

Jouwersma, C. "On the Theory of Peeling". Journal of Polymer Science, vol. XLV, Issue 145, (1960); pp. 253-255 (Year: 1960).*
Office Action issued for Japanese Patent Application No. 2015-523038 dated Mar. 1, 2016 (3 pages).
XP002749445; "ADRIANA.Code—Calculation of Molecular Descriptors;" Feb. 18, 2015 (Feb. 18, 2015), p. 1, Retrieved from the Internet: URL:https://web.archive.org/web/20150218043343/http://www.molecular-networks.com/products/adrianacode [retrieved on Oct. 29, 2015].
Search Report issued for European Patent Application No. 14 782 948.5 dated Dec. 6, 2016, pp. 13.
Office Action issued for Korean Patent Application No. 10-2014-0041568 dated Feb. 21, 2017, pp. 5.
International Search Report issued in International Application No. PCT/KR2014/003044 dated Jul. 8, 2014, 2 pages.
Office Action issued for Korean Patent Application No. 10-2014-0041571 dated Apr. 17, 2017 (7 pages).

* cited by examiner

[Figure 1]
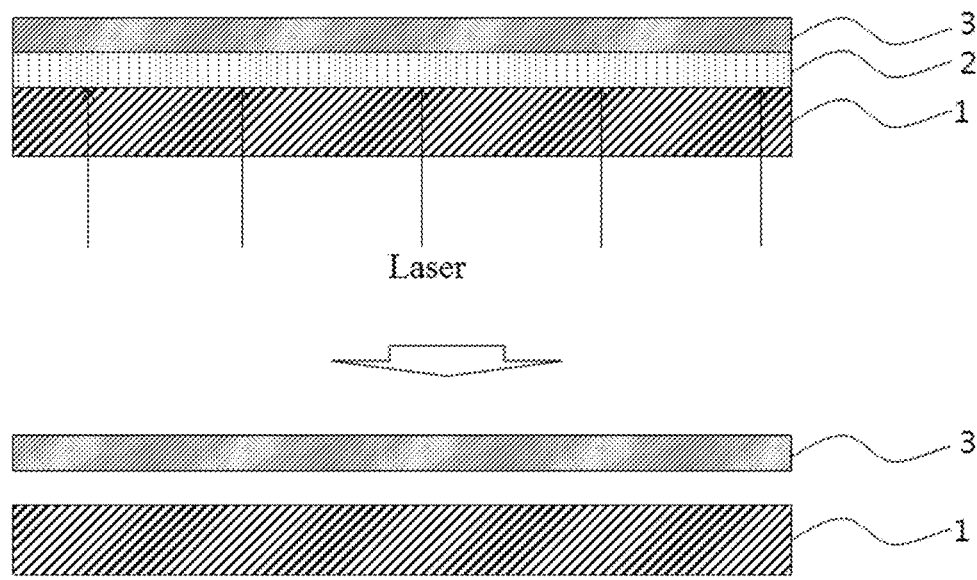
[Figure 2]
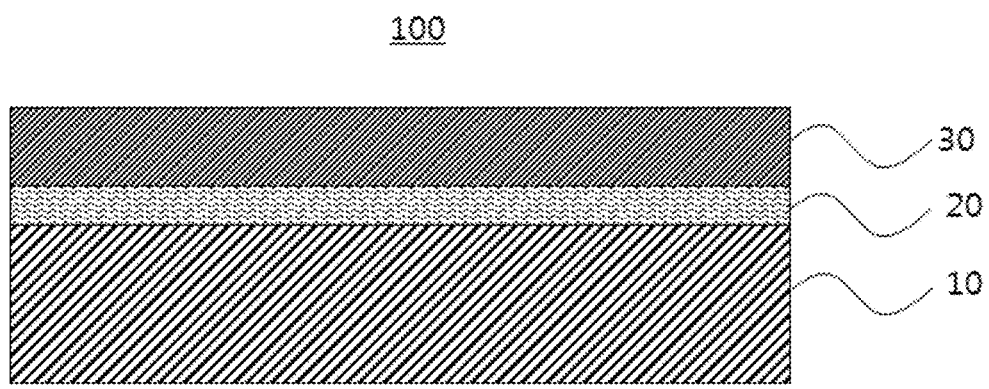

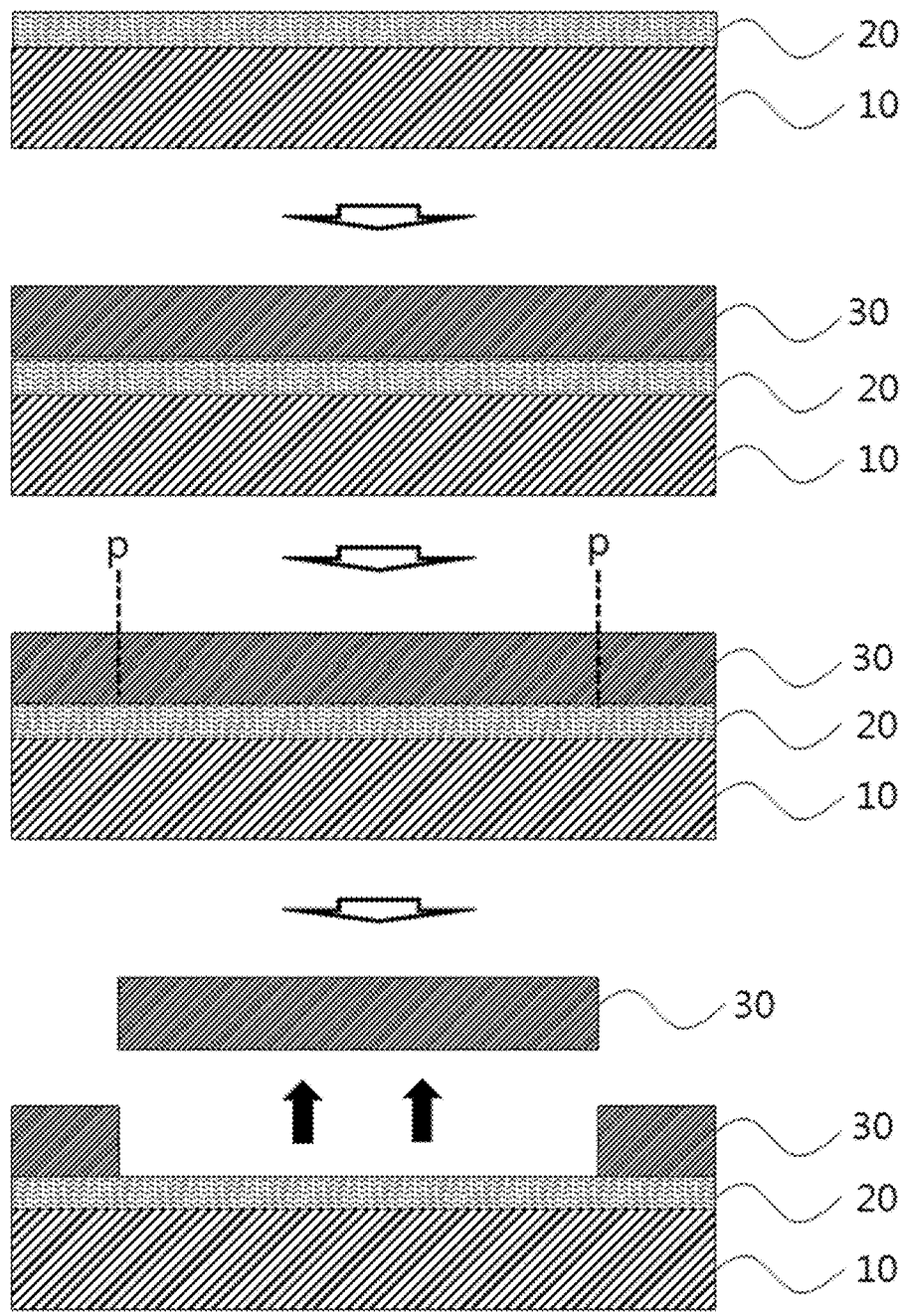

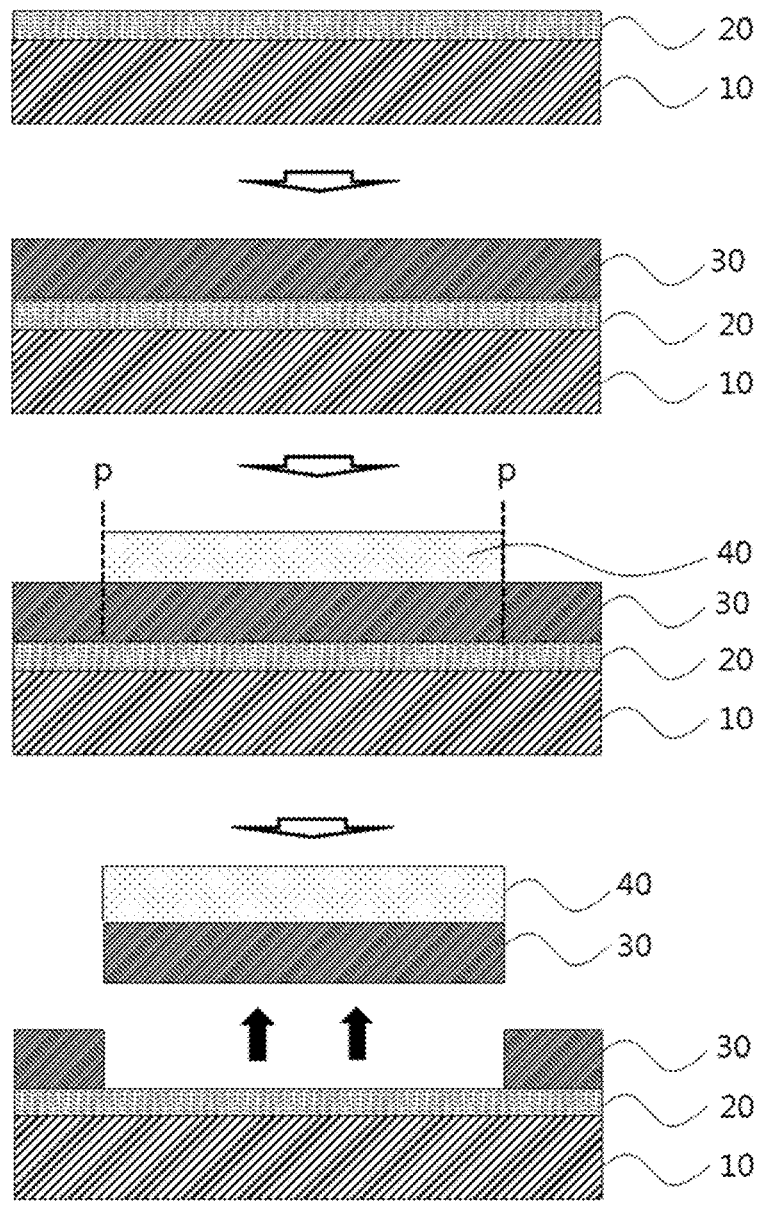

【Figure 4】
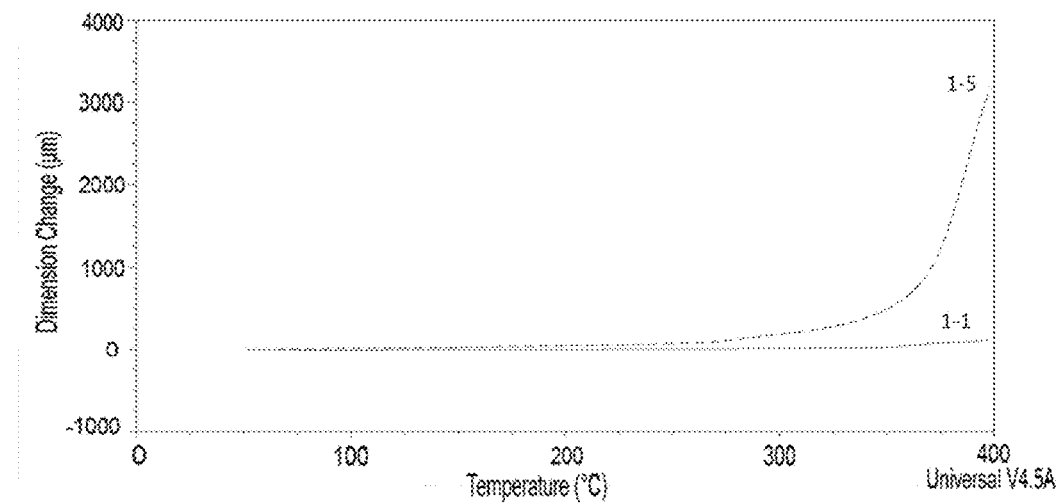
【Figure 5】
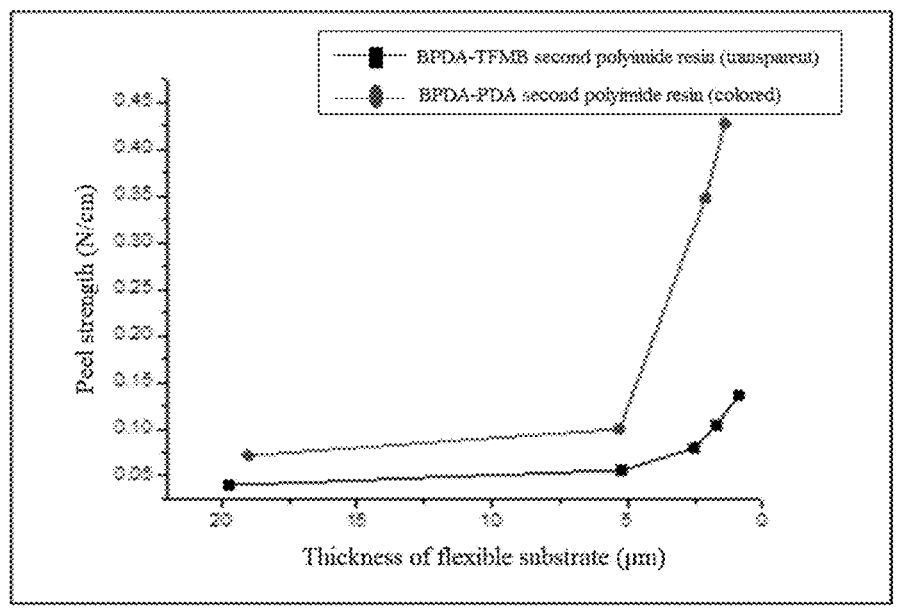

【Figure 6】
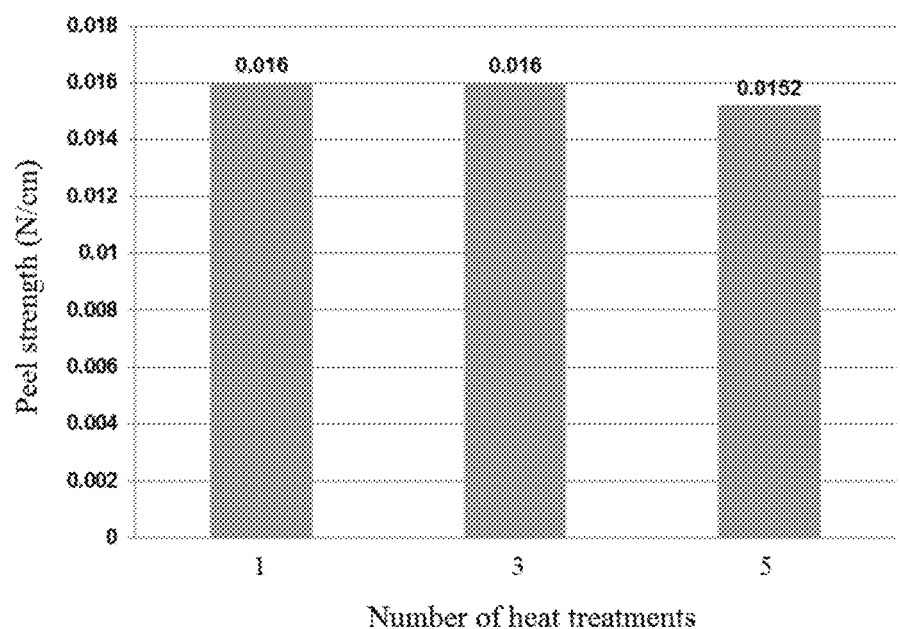

LAMINATE, AND ELEMENT COMPRISING SUBSTRATE MANUFACTURED USING SAME

TECHNICAL FIELD

The present invention relates to a laminate including a flexible substrate and a carrier substrate from which the flexible substrate is easily separated even without the need for further processing such as laser or light irradiation, thus facilitating the fabrication of a device (for example, a flexible display device) having the flexible substrate. The present invention also relates to a device including a substrate produced using the laminate.

BACKGROUND ART

The display device market is rapidly changing based on flat panel displays (FPDs) that are easy to fabricate over a large area and can be reduced in thickness and weight. Such flat panel displays include liquid crystal displays (LCDs), organic light emitting displays (OLEDs), and electrophoresis devices.

In line with recent efforts to further extend the application and use of flat panel displays, particular attention has focused on so-called flexible display devices in which flexible substrates are applied to flat panel displays. The application of such flexible display devices is particularly reviewed based on mobile devices such as smart phones and the application fields thereof are gradually extended.

Processes for the formation and handling of display device structures such as thin film transistors (TFTs) on plastic substrates (TOP) are important in the fabrication flexible display devices. However, due to the flexibility of flexible substrates included in flexible display devices, many problems still remain in terms of processing when flexible plastic substrates are directly employed in place of existing glass device substrates to form device structures.

Particularly, a thin film glass included in a flexible substrate tends to be brittle when an impact is applied thereto. Due to this tendency, a process for producing a display substrate is carried out in a state in which thin film glass is placed on carrier glass. FIG. 1 schematically illustrates a process for fabricating a device (e.g., a flexible display device) having a flexible substrate according to the prior art.

Referring to FIG. 1, a sacrificial layer 2 composed of a suitable material such as a-silicon is formed on a carrier substrate 1 such as a glass substrate, and a flexible substrate 3 is formed thereon. Thereafter, a device structure such as a thin film transistor is formed on the flexible substrate 3 supported by the carrier substrate 1 in accordance with a conventional process for the fabrication of a device on a glass substrate. Then, laser or light is irradiated onto the carrier substrate 1 to destroy the sacrificial layer 2 and separate the flexible substrate 3 on which the device structure is formed, completing the fabrication of a device (for example, a flexible display device) having the flexible substrate 3.

According to the prior art method, however, the laser or light irradiation affects the device structure, increasing the risk of defects. Further, a system for the laser or light irradiation and a separate process are required, disadvantageously rendering the overall device fabrication process complex and markedly increasing the fabrication cost.

Although not illustrated in FIG. 1, it is often necessary to form an additional adhesive layer between the sacrificial layer 2 composed of a-Si and the flexible substrate 3 due to insufficient adhesion between the sacrificial layer and the flexible substrate. This makes the overall process more complicated and the conditions for laser or light irradiation more severe, which increases the risk that the reliability of the device may be adversely affected.

PRIOR ART DOCUMENTS

Patent Documents (Patent Document 1) PCT International Publication No. WO 2000-066507 (published on Nov. 9, 2000)

DISCLOSURE

Technical Problem

It is an object of the present invention to provide a laminate including a flexible substrate and a carrier substrate from which the flexible substrate is easily separated even without the need for further processing such as laser or light irradiation, thus facilitating the fabrication of a device (for example, a flexible display device) having the flexible substrate, and a method for producing the laminate.

It is a further object of the present invention to provide a device substrate produced using the laminate and a method for producing the device substrate.

It is another object of the present invention to provide a device including a substrate produced using the laminate.

Technical Solution

One aspect of the present invention provides a laminate comprising: a carrier substrate; a first polyimide resin layer disposed on at least one surface of the carrier substrate and a second polyimide resin layer disposed on the first polyimide resin layer, wherein the first polyimide resin layer has a coefficient of thermal expansion (CTE) equal to or lower than the CTE of the second polyimide resin layer at a temperature of 100 to 200° C., and the adhesive strength of the first resin layer to the second resin layer decreases when a physical stimulus causing no chemical changes in the first resin layer is applied to the laminate.

The difference between the coefficients of thermal expansion (CTE) at a temperature of 100 to 200° C. of the first and second polyimide resin layers may be 60 ppm/° C. or less.

The physical stimulus may be applied such that the cross-sections of the laminate are exposed.

The first polyimide resin layer may have an adhesive strength of at least 1 N/cm to the second polyimide resin layer before the physical stimulus is applied but have a peel strength not greater than 0.3 N/cm from the second polyimide resin layer after the physical stimulus is applied.

The first polyimide resin layer may comprise a first polyimide resin having a similarity score not greater than 0.5, as calculated by Equation 1:

$$\text{Similarity score} = \alpha_{FIT}(k_1 \times Ls_{Dianhydride,i} + k_2 \times Ls_{Diamine,j})_0^k \quad [\text{Equation 1}]$$

where $$Ls_{dianhydride,i} = \text{Exp}[-k_3 \times \text{Coeff}_i] \times V_i^{\gamma}{}_0$$

$$Ls_{diamine,j} = \text{Exp}[-k_4 \times \text{Coeff}_j] \times V_j^{\gamma}{}_0$$

$k_0=2.00$,
$y_0=-1.00$,
$k_1=206.67$,
$k_2=124.78$,
$k_3=3.20$,
$k_4=5.90$,

Coeff$_i$ and Coeff$_j$ are molecular asphericities calculated from the structures of dianhydride i and diamine j as monomers of the polyimide, respectively, using ADRIANA. Code (Molecular Networks GmbH), $V_i$ and $V_j$ are McGowan volumes calculated from the structures of dianhydride i and diamine j as the monomers, respectively, using ADRIANA.Code (Molecular Networks GmbH), and $\alpha_{FIT}$ is 1.0 if $\exp(-4.0\times|\text{Coeff}_i-\text{Coeff}_j|)+0.08<0.90$ and is a constant from 0.1 to 0.95 if $\exp(-4.0\times|\text{Coeff}_i-\text{Coeff}_j|)+0.08\geq0.90$.

The first polyimide resin may have an imidization degree of 60% to 99% when the imidization degree is defined as the percentage of the integrated intensity of the CN bands observed at 1350 to 1400 cm-1 or 1550 to 1650 cm-1 in the IR spectrum after a composition including a polyamic acid resin is applied and imidized at a temperature of 200° C. or above with respect to the integrated intensity (100%) of the CN bands observed in the same wavelength range after the composition is imidized at a temperature of 500° C. or above.

The first polyimide resin may have a glass transition temperature of 200° C. or above and a decomposition temperature of 400° C. or above.

The first polyimide resin layer for the laminate may be formed by applying a composition including a polyimide resin or a precursor thereof on a carrier substrate and curing the composition at a temperature equal to or 0 to 200° C. lower than the curing temperature of the second polyimide resin layer.

The first polyimide resin layer may comprise a first polyimide resin prepared by reacting an aromatic tetracarboxylic dianhydride of Formula 1:

[Formula 1]

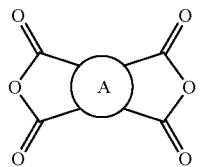

wherein A is a tetravalent aromatic organic group of Formula 2a or 2b:

[Formula 2a]

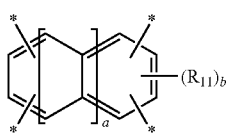

wherein $R_{11}$ is a $C_1$-$C_4$ alkyl or $C_1$-$C_4$ haloalkyl group, a is an integer from 0 to 3, and b is an integer from 0 to 2,

[Formula 2b]

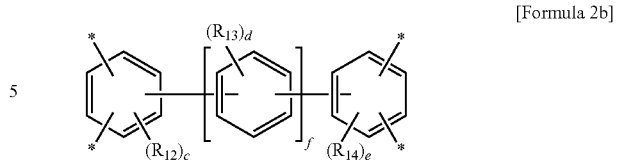

wherein $R_{12}$ to $R_{14}$ are each independently a $C_1$-$C_4$ alkyl or $C_1$-$C_4$ haloalkyl group, c and e are each independently an integer from 0 to 3, d is an integer from 0 to 4, and f is an integer from 0 to 3, with an aromatic diamine compound having a linear structure to prepare a polyamic acid, and curing the polyamic acid at a temperature of 200° C. or above.

The aromatic diamine compound may be represented by Formula 4a or 4b:

[Formula 4a]

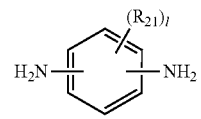

wherein $R_{21}$ is a $C_1$-$C_{10}$ alkyl or $C_1$-$C_{10}$ haloalkyl group and l is an integer from 0 to 4,

[Formula 4b]

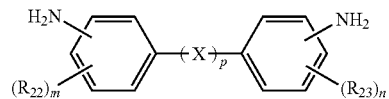

wherein $R_{22}$ and $R_{23}$ are each independently a $C_1$-$C_{10}$ alkyl or $C_1$-$C_{10}$ haloalkyl group, X is selected from the group consisting of —O—, —CR$_{24}$R$_{25}$—, —C(=O)—, —C(=O)O—, —C(=O)NH—, —S—, —SO—, —SO$_2$—, —O[CH$_2$CH$_2$O]$_q$—, $C_6$-$C_{18}$ monocyclic and polycyclic cycloalkylene groups, $C_6$-$C_{18}$ monocyclic and polycyclic arylene groups, and combinations thereof, $R_{24}$ and $R_{25}$ are each independently selected from the group consisting of a hydrogen atom, $C_1$-$C_{10}$ alkyl groups, and $C_1$-$C_{10}$ haloalkyl groups, q is an integer of 1 or 2, m and n are each independently an integer from 0 to 4, and p is an integer of 0 or 1.

The first polyimide resin layer may have a coefficient of thermal expansion (CTE) not higher than 30 ppm/° C. at a temperature of 100 to 200° C. and a 1% thermal decomposition temperature (Td1%) of 450° C. or above.

The first polyimide resin layer may have a thickness of 0.05 to 5 μm.

The laminate may include a second polyimide resin having an imidization degree of 50 to 99% and a glass transition temperature of 200° C. or above.

A further aspect of the present invention provides a method for producing a laminate, including: forming a first polyimide resin layer including a first polyimide resin on at least one surface of a carrier substrate; forming a second polyimide resin layer by applying a composition including a second polyimide resin or a precursor thereof on the first polyimide resin layer and curing, wherein the first polyimide resin layer may have a coefficient of thermal expansion (CTE) equal to or lower than the CTE of the second polyimide resin layer at a temperature of 100 to 200° C.

The first polyimide resin layer may be formed by applying a composition including the first polyimide resin or a precursor thereof on at least one surface of a carrier substrate and curing.

In the method for producing a laminate, the first polyimide resin layer may be cured at a temperature of 200° C. or above and the second polyimide resin layer may be cured at a temperature equal to or 0° C. to 200° C. higher than the curing temperature of the first polyimide resin layer.

The method for producing a laminate may further include the step of heat treating the first or second polyimide resin layer at a temperature of 300° C. or above for 1 to 30 minutes after forming the first or second polyimide resin layer.

Another aspect of the present invention provides a method for producing a device substrate, including: forming a first polyimide resin layer including a first polyimide resin on at least one surface of a carrier substrate; applying a composition including a second polyimide resin or a precursor thereof on the first polyimide resin layer and curing to prepare a laminate having a second polyimide resin layer; applying a physical stimulus to the laminate without causing chemical changes in the first polyimide resin layer; and separating the second polyimide resin layer from the first polyimide resin layer formed on the carrier substrate, wherein the first polyimide resin layer may have a coefficient of thermal expansion (CTE) at a temperature of 100 to 200° C. equal to or lower than that of the second polyimide resin layer.

The physical stimulus is applied such that the cross-sections of the laminate are exposed.

A substrate for a device according to another aspect of the present invention is prepared by the method described above.

Yet another aspect of the present invention provides a device fabricated by a method including: producing a laminate including a first polyimide resin layer on at least one surface of a carrier substrate; applying a composition including a second polyimide resin or a precursor thereof on the first polyimide resin layer and curing to produce a laminate; forming a device structure on the second polyimide resin layer of the laminate; applying a physical stimulus to the laminate on which the device structure is formed, without causing chemical changes in the first polyimide resin layer, and separating the second polyimide resin layer on which the device structure is formed, from the first polyimide resin layer of the laminate; wherein the first polyimide resin layer has a coefficient of thermal expansion (CTE) at a temperature of 100 to 200° C. equal to or lower than that of the second polyimide resin layer, and the adhesive strength of the first polyimide resin layer to the second polyimide resin layer is reduced by the physical stimulus.

The device may be selected from the group consisting of solar cells, organic light emitting diode lighting devices, semiconductor devices, and display devices.

The display devices may be flexible organic electroluminescent devices.

Details of other embodiments according to various aspects of the invention are included in the following description.

Advantageous Effects

In the laminate of the present invention, including a polyimide resin layer that the flexible substrate can be easily separated from the carrier substrate by the application of a relatively small physical stimulus such as cutting, eliminating the need for laser or light irradiation. Therefore, the use of the laminate facilitates the fabrication of a device (for example, a flexible display device) including the flexible substrate.

According to the present invention, since there is no need for additional processing such as laser or light irradiation, the fabrication process of the device can be simplified and the fabrication cost can be greatly lowered. In addition, the device can be prevented from deterioration of reliability and occurrence of defects caused by laser or light irradiation. This ensures excellent characteristics of the device.

DESCRIPTION OF DRAWINGS

FIG. 1 is a schematic view illustrating a conventional process for fabricating a device including a flexible substrate, FIG. 2 is a cross-sectional view schematically illustrating the structure of a laminate according to one embodiment of the present invention, FIGS. 3a and 3b are schematic views illustrating processes for the production of a device substrate and the fabrication of a display device using a laminate according to another embodiment of the present invention, respectively, FIG. 4 is a graph showing changes in the dimension of a laminate including different first polyimide resin layers with varying temperatures in Test Example 1, FIG. 5 is a graph showing changes in the peel strength of debonding layers with varying thicknesses of flexible substrates in Test Example 3, and FIG. 6 is a graph showing changes in the peel strength of debonding layers with increasing number of subsequent heat treatments after curing of the debonding layers in Test Example 5.

MODE FOR INVENTION

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, detailed explanations of related art are omitted when it is deemed that they may unnecessarily obscure the essence of the present invention.

It will be understood that when an element such as a layer, membrane, film or substrate is referred to as being "above" or "on" another element, it can be directly on the other element or one or more intervening elements may also be present. It will also be understood that when an element such as a layer, membrane, film or substrate is referred to as being "under" another element, it can be directly under the other element or one or more intervening elements may also be present.

Unless otherwise mentioned, the term 'physical stimulus' used herein is intended to include mechanical stimuli such as peeling, cutting, friction, tension and compression causing no chemical changes, and it refers to a stimulus by which the cross-sections of a laminate can be exposed regardless of what means or mode is employed. In some cases, the physical stimulus may have a strength of 0 to 0.1 N per unit area. That is, the application of the physical stimulus means that the cross-sections of a laminate are exposed regardless of what means is used. Preferably, the physical stimulus is applied in such a manner that two or more cross-sections of a laminate forming the end portions of a flexible substrate are exposed at predetermined intervals.

The physical stimulus is applied such that the cross-sections of the laminate are exposed and may have a strength not greater than 0.1 N. Specific examples of methods for applying the physical stimulus to expose the cross-sections of the laminate include, but are not limited to, cutting, laser cutting, and diamond scribing.

One aspect of the present invention provides a laminate including: a carrier substrate; a first polyimide resin layer disposed on at least one surface of the carrier substrate; and a second polyimide resin layer disposed on the first polyimide resin layer, wherein the first polyimide resin layer has a coefficient of thermal expansion (CTE) not higher than the CTE of the second polyimide resin layer at a temperature of 100 to 200° C., and the adhesive strength of the first polyimide resin layer to the second polyimide resin layer is reduced by a physical stimulus without causing chemical changes in the first polyimide resin layer.

As used herein, the term 'adhesive strength' refers to the adhesive strength of the first polyimide resin layer to the second polyimide resin layer before the physical stimulus is applied, and the term 'peel strength' refers to the adhesive strength of the first polyimide resin layer to the second polyimide resin layer after the physical stimulus is applied. The term 'adhesive strength' is interchangeably used with the term 'peel strength'.

The present invention also provides a method for producing a laminate including the steps of forming a first polyimide resin layer by applying a composition comprising a first polyimide resin or a precursor thereof on at least one surface of a carrier substrate and curing the composition; and forming a second polyimide resin layer by applying a composition comprising a second polyimide resin or a precursor thereof on the first polyimide resin layer and curing the composition.

The present invention also provides a method for producing a device substrate including the steps of: forming a first polyimide resin layer by applying a composition comprising a first polyimide resin or a precursor thereof on at least one surface of a carrier substrate and curing; applying a composition comprising a second polyimide resin or a precursor thereof on the first polyimide resin layer and curing the composition to produce a laminate; and separating the second polyimide resin layer from the first polyimide resin layer of the laminate by applying a physical stimulus to the laminate, without causing chemical changes in the first polyimide resin layer.

The present invention also provides a device substrate produced by the aforementioned method.

The present invention also provides a device including the device substrate produced by the aforementioned method.

A more detailed description will now be given of a laminate, a method for producing the laminate, a device substrate produced using the laminate, a method for producing the device substrate, a device including the device substrate, and a method for fabricating the device according to embodiments of the present invention.

One aspect of the present invention provides a laminate including: a carrier substrate; a first polyimide resin layer disposed on at least one surface of the carrier substrate; and a second polyimide resin layer disposed on the first polyimide resin layer, wherein the first polyimide resin layer has a coefficient of thermal expansion (CTE) not higher than the CTE of the second polyimide resin layer at a temperature of 100 to 200° C., and the adhesive strength of the first polyimide resin layer to the second polyimide resin layer is reduced by a physical stimulus without causing chemical changes in the first polyimide resin layer.

As a result of experiments conducted by the present inventors, it was found that when the first polyimide resin layer including a polyimide resin with particular characteristics is disposed between the carrier substrate and the second polyimide resin layer as a flexible substrate, which is to be applied as a substrate for a device (for example, a flexible display device), the application of a simple physical stimulus makes the flexible substrate easily separable from the debonding layer without the need for laser or light irradiation, facilitating the fabrication of the device having the flexible substrate. Such functions and effects are thought to be attributed to the characteristics of the first polyimide resin layer, which will be described below.

FIG. 2 is a cross-sectional view schematically illustrating the structure of a laminate according to one embodiment of the present invention. The structure of FIG. 2 is merely for illustrative purposes and the invention is not limited thereto.

Referring to FIG. 2, the laminate 100 of the present invention includes a carrier substrate 10, a first polyimide resin layer 20 comprising a first polyimide resin and disposed on at least one surface of the carrier substrate, and a second polyimide resin layer 30 comprising a second polyimide resin and disposed on the first polyimide resin layer.

The carrier substrate 10 may be any one that is used to support the second polyimide resin layer 30 such that a device can be easily fabricated on the laminate 100. Specific examples of suitable carrier substrates include glass substrates, metal substrates such as stainless steel substrates, and multilayer structures thereof. Particularly preferred is a glass substrate that is most easily applicable to the fabrication of a device.

The carrier substrate 10 may be pretreated by etching, for example, corona treatment under an ozone atmosphere, flame treatment, sputtering, UV irradiation or e-beam irradiation. This pretreatment may enhance the adhesion of the carrier substrate to the first polyimide resin layer.

The thickness and size of the carrier substrate 10 may be suitably selected depending on the kind of a device to which the laminate is to be applied. The thickness of the carrier substrate 10 is preferably in the range of 0.1 to 50 mm taking into consideration the transparency of the substrate. Within this range, the mechanical strength of the carrier substrate is sufficiently high to support the second polyimide resin layer 30.

The first polyimide resin layer 20 is disposed on at least one surface of the carrier substrate 10.

The first polyimide resin layer 20 exhibits an adhesive strength above a predetermined level so as to appropriately fix and support the second polyimide resin layer 30 in a subsequent process for fabricating a device including forming a device structure on the second polyimide resin layer 30. However, after the device fabrication process is completed, the adhesive strength of the first polyimide resin layer to the second polyimide resin layer 30 can be reduced by a simple physical stimulus such as cutting without laser or light irradiation, and hence, the first polyimide resin layer 20 can be easily separated from the second polyimide resin layer 30.

More specifically, the first polyimide resin layer 20 exhibits an adhesive strength of at least about 1 N/cm, at least about 2 N/cm, or about 3 to about 5 N/cm to the second polyimide resin layer 30 before the application of the physical stimulus but can exhibit a peel strength of about 0.3 N/cm or less, for example, about 0.2 N/cm or less, about 0.1 N/cm or less, or about 0.001 to 0.05 N/cm after the application of the physical stimulus.

The peel strength of the first polyimide resin layer 20 can be measured under the conditions shown in Table 1.

TABLE 1

| Conditions for peel strength measurement | Film width (mm) | 10 |
|---|---|---|
| | Film length (mm) | 100 |
| | Rate (mm/min) | 50 |
| | Tester | Texture Analyzer (TA.XT plus, Stable micro systems) |

Specifically, the peel strength can be determined by the following procedure. First, the first polyimide resin layer and the second polyimide resin layer are sequentially formed on a glass substrate to prepare a laminate sample. A physical stimulus is applied to cut the laminate sample into a rectangular shape having a width of 10 mm. The force required to peel the ends of the second polyimide resin layer from the first polyimide resin layer is measured using the tester under the conditions shown above.

Further, the adhesive strength can be determined by the following procedure. First, the first polyimide resin layer and the second polyimide resin layer are sequentially formed on a glass substrate to prepare a laminate sample. The laminate sample is cut into a rectangular shape having a width of 100 mm and a tape having a width of 10 mm is attached to the end of the second polyimide layer. The force applied when the second polyimide layer is peeled off from the first polyimide resin layer by the tape adhered to the end of the second polyimide resin layer is measured. A tester and conditions for measuring the force may be the same as those for the peel strength measurement shown in Table 1.

The desired adhesive strength and peel strength of the first polyimide resin layer can be achieved by controlling various factors, for example, the kind and content of monomers for the polyimide resin, the imidization degree and the coefficient of thermal expansion (CTE) of the polyimide resin, etc.

Specifically, the first polyimide resin layer may be formed by applying a composition including a polyimide resin or a polyamic acid as the precursor thereof and curing the composition, and, in the present invention, a coefficient of thermal expansion (CTE) at a temperature of 100 to 200° C. of the first polyimide resin layer is controlled to be equal to or lower than that of the second polyimide resin layer.

The difference between the coefficients of thermal expansion at a temperature of 100 to 200° C. of the first and second polyimide resin layers may be not higher than 60 ppm/° C., not higher than 50 ppm/° C., not higher than 40 ppm/° C., not higher than 30 ppm/° C., or not higher than 25 ppm/° C. Herein the coefficient of thermal expansion (CTE) at a temperature of 100 to 200° C. may mean the average value of CTE in the temperature rage mentioned.

By satisfying the aforementioned CTE relationship, the peel strength of the first polyimide resin layer to the second polyimide resin layer can be reduced such that it can be easily separated from the second polyimide resin layer by a simple physical stimulus.

As a result of experiments conducted by the present inventors, it was confirmed that the curing temperature conditions for the preparation of the polyimide resin, the imidization degree of the polyimide resin, and the peel strength of the polyimide resin layer can satisfy the relationships shown in Table 2.

TABLE 2

| Curing temperature (° C.) | 150 | 200 | 250 | 300 | 350 | 500 |
|---|---|---|---|---|---|---|
| Imidization degree (%) | 10.36 | 49.21 | 79.34 | 92.78 | 95.69 | 100 |
| Peel strength (N/cm) | 2.8 | 2.8 | 0.03 | 0.016 | 0.03 | 0.35 |

As shown in Table 2, when the first polyimide resin layer is formed by applying a composition including a polyamic acid resin as a precursor of the first polyimide resin to the carrier substrate and curing the composition at a temperature of about 200° C. or above or 250° C. to 500° C., the polyimide resin included in the first polyimide resin layer has an imidization degree of about 60% to about 99%, about 70% to about 98%, or about 75% to about 96%, and the first polyimide resin layer has a peel strength not greater than about 0.3 N/cm. The use of the laminate according to this embodiment markedly simplifies a process for the fabrication of a device (such as a flexible display device) including the flexible substrate, which has already been described above. Herein, the imidization degree of the polyimide resin can be defined as the percentage of the integrated intensity of the CN bands observed at 1350 to 1400 cm-1 or 1550 to 1650 cm-1 in the IR spectrum after a composition including a polyimide precursor, for example, a polyamic acid resin, is applied and imidized at a temperature of 200° C. or above with respect to the integrated intensity (100%) of the CN bands observed in the same wavelength range after the composition is imidized at a temperature of 500° C. or above.

The first polyimide resin prepared under the control of the curing temperature may have a glass transition temperature of at least about 200° C., at least about 300° C., or about 350° C. to about 500° C. and a decomposition temperature of at least 400° C. or 400° C. to 600° C. Due to good heat resistance of the first polyimide resin, the first polyimide resin layer is highly resistant to high temperature during processing for the fabrication of a device and can be prevented from warpage in the course of fabricating a device on the laminate. In addition, the first polyimide resin layer can prevent the reliability of a device from deteriorating. As a result, the use of the first polyimide resin layer enables the fabrication of a device with improved characteristics and high reliability.

Specifically, the first poylimide resin layer of the laminate according to this embodiment may have a coefficient of thermal expansion (CTE) not higher than about 30 ppm/° C., not higher than about 25 ppm/° C., or from about 1 to about 17 ppm/° C. at a temperature of 100 to 200° C. and a 1% thermal decomposition temperature (Td1%) of 450° C. or above.

The first polyimide resin layer 20 meeting the requirements in terms of structural and physical properties is completely peeled from the second polyimide resin layer 30 and thus has no influence on the transparency and optical properties of a device substrate.

The present inventors have found that the adhesive strength of the debonding layer varies depending on the kinds of a dianhydride and a diamine for the polyimide constituting the debonding layer. Based on this finding, the present inventors suggest a method for quantitatively evaluating the adhesive strength of the debonding layer. Specifically, the present inventors have developed a monomer combination based similarity score. A higher similarity score represents a nonlinear/nonplanar structure having a higher structural similarity to a sphere. Meanwhile, a lower similarity score represents a linear/planar structure having a lower structural similarity to a sphere. In the present invention, the similarity score is preferably not greater than 0.5.

The similarity is calculated by Equation 1.

$$\text{Similarity score} = \alpha_{FIT}(k_1 \times Ls_{dianhydride,i} + k_2 \times Ls_{diamine,j})_0^k \quad \text{[Equation 1]}$$

where $Ls_{Dianhydride,i} = \text{Exp}[-k_3 \times \text{Coeff}_i] \times V_i^{y_0}$ $Ls_{Diamine,j} = \text{Exp}[-k_4 \times \text{Coeff}_j] \times V_j^{y_0}$ $k_0=2.00$,
$y_0=-1.00$,
$k_1=206.67$,
$k_2=124.78$,
$k_3=3.20$,
$k_4=5.90$, Coeffi and Coeffj are molecular asphericities calculated from the structures of dianhydride i and diamine j as monomers of the polyimide, respectively, using ADRIANA.Code (Molecular Networks GmbH), Vi and Vj are McGowan volumes calculated from the structures of dianhydride i and diamine j as the monomers, respectively, using ADRIANA.Code (Molecular Networks GmbH), and $\alpha_{FIT}$ is 1.0 if $\exp(-4.0 \times |\text{Coeff}_i - \text{Coeff}_j|) + 0.08 < 0.90$ and is a constant from 0.1 to 0.95 if $\exp(-4.0 \times |\text{Coeff}_i - \text{Coeff}_j|) + 0.08 \geq 0.90$.

In Equation 1, if $\exp(-4.0 \times |\text{Coeff}_i - \text{Coeff}_j|) + 0.08 \geq 0.90$, $\alpha_{FIT}$ is a constant from 0.1 to 0.95, preferably from 0.2 to 0.5, most preferably 0.33.

ADRIANA.Code is a program developed by Molecular Networks GmbH, Germany and is mainly used to calculate the inherent physical, chemical and electrical properties of molecules. When the structural information of molecules is input to the program, the molecular asphericities and McGowan volumes can be calculated.

A polyamic acid resin as a precursor of the first polyimide resin may be prepared by polymerizing a tetracarboxylic dianhydride compound and a diamine compound as monomers.

Specific examples of tetracarboxylic dianhydride compounds suitable as monomers include pyromellitic dianhydride (PMDA), 3,3',4,4'-biphenyltetracarboxylic dianhydride (BPDA), meso-buthane-1,2,3,4-tetracarboxylic dianhydride, 3,3',4,4'-benzophenone tetracarboxylic dianhydride (BTDA), 2,3,3',4'-diphenylether tetracarboxylic dianhydride, (ODPA), 3,3',4,4'-diphenylsulfone tetracarboxylic dianhydride (DSDA), 4,4'-(hexafluoroisopropylidene)diphthalic anhydride, 3,3',4,4'-biphenyltetracarboxylic dianhydride (S-BPDA), 1,2,3,4-cyclobutane tetracarboxylic dianhydride, 1,2-dimethyl-1,2,3,4-cyclobutane tetracarboxylic dianhydride, 1,2,3,4-tetramethyl-1,2,3,4-cyclobutane tetracarboxylic dianhydride, 1,2,3,4-cyclopentane tetracarboxylic dianhydride, 1,2,4,5-cyclohexane tetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane acetic dianhydride, bicyclo[2.2.2]octo-7-en-2,3,5,6-tetracarboxylic dianhydride, 2,3,4,5-tetrahydrofuran tetracarboxylic dianhydride, 3,5,6-tricarboxy-2-norbornane acetic dianhydride, and derivatives thereof. It should be understood that other various tetracarboxylic dianhydrides may also be used.

Specific examples of diamine compounds suitable as monomers include: aromatic diamines, such as p-phenylenediamine (PDA), m-phenylenediamine (m-PDA), 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(3-aminophenoxy)phenyl]propane, 2,2-bis[4-(4-aminophenoxy)phenyl]propane (6HMDA), 2,2'-bis(trifluoromethyl)benzidine (TFMB), 3,3'-bis(trifluoromethyl)-4,4'-diaminobiphenyl (3,3'-TFDB), 4,4'-bis(3-aminophenoxy)diphenylsulfone (DBSDA), bis(3-aminophenyl)sulfone (3DDS), bis(4-aminophenyl)sulfone (4DDS), 1,3-bis(3-aminophenoxy)benzene (APB-133), 1,4-bis(4-aminophenoxy)benzene (APB-134), 2,2'-bis[3(3-aminophenoxy)phenyl]hexafluoropropane (3-BDAF), 2,2'-bis[4-(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F), and 4,4'-oxydianiline (ODA); and aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxy)ethane, bis(3-aminopropyl)ether, 1,4-bis(3-aminopropyl)piperazine, 3,9-bis(3-aminopropyl)-2,4,8,10-tetraoxaspiro[5.5]-undecane, and 1,3-bis(3-aminopropyl)tetramethyldisiloxane.

There is no particular restriction on the kinds of the tetracarboxylic dianhydride compound and the diamine compound, but it is important for the acid dianhydride to have no linker structure between aromatic rings in order to more appropriately meet the requirements of the first polyimide resin layer in terms of physical properties, for example, low CTE range and peel strength described above.

The tetracarboxylic dianhydride compound is preferably an aromatic tetracarboxylic dianhydride of Formula 1:

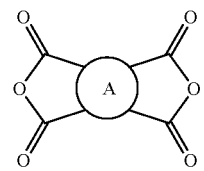

[Formula 1]

wherein A is a tetravalent aromatic organic group derived from an acid dianhydride, specifically a tetravalent aromatic organic group of Formula 2a or 2b:

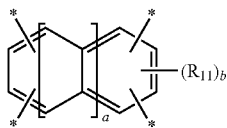
[Formula 2a]

wherein $R_{11}$ is a $C_1$-$C_4$ alkyl (for example, methyl, ethyl or propyl) or $C_1$-$C_4$ haloalkyl (for example, fluoromethyl, bromomethyl, chloromethyl or trifluoromethyl) group, a is an integer from 0 to 3, and b is an integer from 0 to 2, preferably 0,

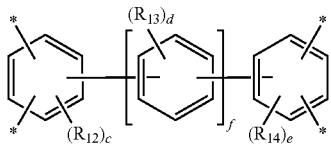
[Formula 2b]

wherein $R_{12}$ to $R_{14}$ are each independently a $C_1$-$C_4$ alkyl (for example, methyl, ethyl or propyl) or $C_1$-$C_4$ haloalkyl (for example, fluoromethyl, bromomethyl, chloromethyl or trifluoromethyl) group, c and e are each independently an integer from 0 to 3, preferably 0, d is an integer from 0 to 4, preferably 0, and f is an integer from 0 to 3.

Particularly, the tetracarboxylic dianhydride is more preferably pyromellitic dianhydride (PMDA) of Formula 3a or 3,3',4,4'-biphenyltetracarboxylic dianhydride (BPDA) of Formula 3b:

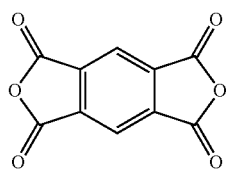
[Formula 3a]

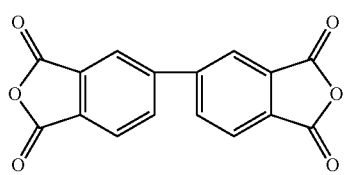
[Formula 3b]

In the compound of Formula 3b, the structure is linear and the two aromatic rings are directly connected without a linker structure.

As the packing density of the first polyimide resin layer 20 increases, the intermolecular space decreases and it is thus difficult for the molecules to interpenetrate, resulting in low bonding strength. As a consequence, the adhesive strength of the first polyimide resin layer 20 to the overlying second polyimide resin layer 30 is reduced and the peel strength of the second polyimide resin layer from the laminate is also reduced. The packing density can be represented by CTE. The higher the packing density, the lower the CTE value, and vice versa. Accordingly, for the preparation of the first polyimide resin layer meeting the requirements in terms of physical properties, it is preferred that the diamine compound is an aromatic diamine compound having a linear structure, specifically, an aromatic diamine compound of Formula 4a or 4b:

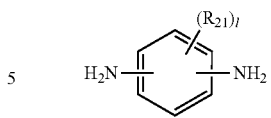
[Formula 4a]

wherein $R_{21}$ is a $C_1$-$C_{10}$ alkyl (for example, methyl, ethyl or propyl) or $C_1$-$C_{10}$ haloalkyl (for example, fluoromethyl, bromomethyl, chloromethyl or trifluoromethyl) group and l is an integer from 0 to 4, preferably 0,

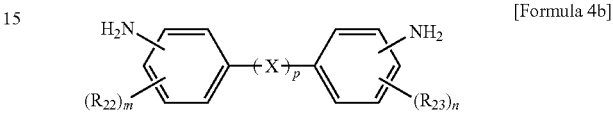
[Formula 4b]

wherein $R_{22}$ and $R_{23}$ are each independently a $C_1$-$C_{10}$ alkyl (for example, methyl, ethyl or propyl) or $C_1$-$C_{10}$ haloalkyl (for example, fluoromethyl, bromomethyl, chloromethyl or trifluoromethyl) group, X is selected from the group consisting of —O—, —$CR_{24}R_{25}$—, —C(=O)—, —C(=O)O—, —C(=O)NH—, —S—, —SO—, —$SO_2$—, —O[$CH_2CH_2$O]$_q$—, $C_6$-$C_{18}$ monocyclic and polycyclic cycloalkylene (for example, cyclohexylene and norbornene) groups, $C_6$-$C_{18}$ monocyclic and polycyclic arylene (for example, phenylene and naphthalene) groups, and combinations thereof, $R_{24}$ and $R_{25}$ are each independently selected from the group consisting of a hydrogen atom, $C_1$-$C_{10}$ alkyl (for example, methyl, ethyl and propyl) groups, and $C_1$-$C_{10}$ haloalkyl (for example, fluoromethyl, bromomethyl, chloromethyl and trifluoromethyl) groups, q is an integer of 1 or 2, m and n are each independently an integer from 0 to 4, preferably 0, and p is an integer of 0 or 1, preferably 0.

Examples of preferred aromatic diamine compounds include p-phenylenediamine (PDA), benzidine (BZD), m-tolidine, or 2,2'-bis(trifluoromethyl)benzidine (TFMB).

These monomers are polymerized in a polar organic solvent to prepare the desired first polyamic acid resin. The polyamic acid resin is subjected to imidization at the curing temperature described above in the presence or absence of an imidization catalyst such as an amine catalyst to prepare the first polyimide resin. Conditions other than the curing temperature for the preparation of the first polyimide resin or the first polyimide resin can be controlled by suitable methods well known to those skilled in the art, and a further explanation thereof is thus omitted.

The first polyimide resin layer 20 may have a thickness of 0.05 to 5 µm, 0.05 to 4 µm, 0.05 to 3 µm, 0.05 to 2 µm, or 0.05 to 1 µm. As the first polyimide resin layer decreases in thickness, its adhesive strength to the carrier substrate increases. However, an excessively small thickness of the first polyimide resin layer leads to an increase in the adhesive strength of the first polyimide resin layer to the second polyimide resin layer, resulting in poor detachability of the first polyimide resin layer from the second polyimide resin layer. Within the thickness range defined above, high adhesive strength of the first polyimide resin layer to the carrier substrate and good detachability of the first polyimide resin layer from the second polyimide resin layer are ensured.

In the laminate, the second polyimide resin layer 30 is disposed on the first polyimide resin layer 20.

The second polyimide resin layer 30 comprises a second polyimide resin cured at a temperature equal to or 0 to 200° C. higher than the curing temperature of the first polyimide resin layer. The second polyimide resin may have an imidization degree of 50 to 99% or 70 to 95%.

The second polyimide resin may have a glass transition temperature (Tg) of at least about 200° C., at least about 300° C., or about 350° C. to about 500° C. and a decomposition temperature (Td) of at least 400° C. or 400° C. to 600° C. Such good heat resistance of the polyimide resin eliminates the risk that the polymer layer may be deformed during subsequent heating for the production of the laminate or a device substrate, and leads to improvements in the heat resistance of the substrate and a device.

The second polyimide resin layer 30 may have a coefficient of thermal expansion (CTE) of about 60 ppm/° C. or less, about 50 ppm/° C. or less, about 40 ppm/° C. or less, or about 1 to 30 ppm/° C. at a temperature of 100 to 200° C., and a 1% thermal decomposition temperature (Td1%) of 450° C. or more or 470° C. or more.

Preferably, the coefficient of thermal expansion (CTE) at a temperature of 100 to 200° C. of the second polyimide resin layer is equal to or lower than that of the first polyimide resin layer. The difference between the coefficients of thermal expansion at a temperature of 100 to 200° C. of the first and second polyimide resin layers may be not higher than 60 ppm/° C., not higher than 50 ppm/° C., not higher than 40 ppm/° C., not higher than 30 ppm/° C., or not higher than 25 ppm/° C. Herein the coefficient of thermal expansion (CTE) at a temperature of 100 to 200° C. may mean the average value of CTE in the temperature rage mentioned.

By satisfying the aforementioned CTE relationship, the peel strength of the first polyimide resin layer to the second polyimide resin layer can be reduced such that it can be easily separated from the second polyimide resin layer by a simple physical stimulus.

The desired physical properties of the second polyimide resin layer can be achieved by controlling various factors, for example, the kind and content of monomers, process and reaction conditions for the polyimide resin, together with the curing condition.

For example, the second polyimide resin may be prepared by polymerization of a tetracarboxylic dianhydride and a diamine compound as monomers to prepare a polyamic acid resin and curing the polyamic acid resin. The second polyimide resin layer may also be formed by drying a composition in the form of a solution including the polyimide resin. The tetracarboxylic dianhydride and the diamine compound are the same as those described in the preparation of the first polyimide resin. However, the desired physical properties of the second polyimide resin layer can be achieved by controlling the reaction ratio between the tetracarboxylic dianhydride and the diamine Specifically, it would be desirable that to use the diamine in an amount of 0.8 to 1.2 moles or 0.9 to 1.1 moles per mole of the tetracarboxylic dianhydride.

The second polyimide resin layer 30 having the above physical properties may have a thickness of 0.5 to 50 µm, 1 to 50 µm, 2 to 50 µm, 3 to 50 µm, or 3 to 30 µm. Particularly, it is preferable that the second polyimide resin layer 30 has an appropriate thickness in relation with the first resin layer. For example, the thickness of the second polyimide resin layer 30 may be 10 to 500 times, 20 to 400 times, 30 to 300 times, or 50 to 200 times larger than that of the first polyimide layer.

The laminate 100 having the above structure may be produced in accordance with a method including the following steps: forming a first polyimide resin layer 20 by applying a composition comprising a first polyimide resin or a precursor thereof on at least one surface of a carrier substrate 10, followed by curing the composition (step 1); and forming a second polyimide resin layer 30 on the first polyimide resin layer 20 by applying a composition comprising a second polyimide resin or a precursor thereof on the first polyimide resin layer, followed by curing the composition (step 2).

Hereinafter, the individual steps will be explained in detail. In step 1, the first polyimide resin layer 20 is formed on a carrier substrate 10.

The carrier substrate 10 is the same as that described above. Before formation of the first polyimide resin layer 20, the carrier substrate may be pretreated by etching, for example, corona treatment under an ozone atmosphere, flame treatment, sputtering, UV irradiation or e-beam irradiation. This pretreatment increases the adhesion of the carrier substrate to the first polyimide resin layer 20.

The first polyimide resin 20 for the laminate may be formed by applying a composition comprising a first polyimide resin or a precursor thereof on at least one surface of the carrier substrate 10 and curing the composition. When a polyamic acid resin is used for the preparation of the first polyimide resin layer 20, imidization of the polyamic acid resin may proceed during the curing process.

The composition may be applied by any suitable technique known in the art. Specific examples of techniques suitable for the application of the composition include spin coating, dip coating, and bar coating. Casting, rolling or spray coating may be suitably used for a continuous process.

Before the curing, drying may be further performed to remove organic solvents present in the composition for the formation of the first polyimide resin layer. The composition may be dried by any suitable technique known in the art. Specifically, the composition may be dried at a temperature of 140° C. or below.

The curing process may be conducted at a temperature equal to or 0 to 200° C. lower than the curing temperature of the second polyimide resin layer 30. Specifically, the curing process may be conducted by heating to a temperature of 200° C. or higher, or 250 to 500° C. This heat treatment may also be performed in multiple stages at various temperatures within the temperature range defined above.

The curing time is not particularly limited and may be, for example, in the range of 3 to 30 minutes.

After the curing, heat treatment may be optionally further performed. The subsequent heat treatment is preferably performed at a temperature of at least 300° C. for 1 to 30 minutes. The heat treatment may be performed only once. Alternatively, the heat treatment may be performed twice or more in multiple stages. For example, the heat treatment may be performed in three stages: first heat treatment at 200 to 250° C., second heat treatment at 300 to 350° C., and third heat treatment at 400 to 450° C.

In step 2, the second polyimide resin layer 30 is formed on the first polyimide resin layer 20 to produce the laminate.

The second polyimide resin layer 30 may be formed on the first polyimide resin layer 20 by applying a composition comprising a second polyimide resin or a second polyamic acid resin as a precursor thereof and curing the composition. The second polyimide resin and a precursor thereof are the same as described above.

The composition for the formation of the second polyimide resin layer may further include at least one additive selected from binders, solvents, cross-linkers, initiators, dispersants, plasticizers, viscosity modifiers, UV absorbers, photosensitive monomers, and sensitizers, which are commonly used in polyimide resin layers.

The curing process for forming the second polyimide resin layer 30 may be conducted by heating to a temperature of 200° C. or higher. Preferably, the process can be conducted at a temperature equal to or 0 to 200° C. higher than the curing temperature of the first polyimide resin layer. The heating may also be performed in multiple stages at various temperatures within the temperature range defined above.

In the laminate thus produced, the first polyimide resin layer exhibits an appropriate adhesive strength to the second polyimide resin layer and can thus properly fix and support the second polyimide resin layer in a subsequent process for the fabrication of a device. Accordingly, the use of the laminate according to this embodiment of the present invention facilitates the production of a substrate of a device (e.g., a flexible display device) including the second polyimide resin layer. In addition, a process for the fabrication of a device can be appropriately carried out on the laminate even without the need for laser or light irradiation for the separation of the second polyimide resin layer, to fabricate a device with excellent characteristics. As a result, the fabrication process of the device having the second polyimide resin layer can be simplified and the fabrication cost can also be reduced.

A further embodiment of the present invention provides a device substrate produced using the laminate and a method for producing the device substrate.

The device substrate may be produced by a method including the following steps: forming a first polyimide resin layer by applying a composition including a polyimide resin or a precursor thereof on at least one surface of a carrier substrate, followed by curing the composition; forming a second polyimide resin layer by applying a composition comprising a second polyimide resin or a precursor thereof on the first polyimide resin layer, followed by curing the composition; and applying a physical stimulus to the second polyimide resin layer to separate the second polyimide resin layer from the first polyimide resin layer formed on the carrier substrate, wherein the curing of the first polyimide resin layer may be conducted at a temperature equal to or 0 to 200° C. lower than the curing temperature of the second polyimide resin layer.

FIG. 3a is a schematic view illustrating a process for the production of a device substrate according to one embodiment of the present invention. FIG. 3a is merely illustrative and the invention is not limited thereto.

Referring to FIG. 3a, the device substrate of the present invention may be produced by a method including the following steps: (S1) forming a first polyimide resin layer 20 on at least one surface of a carrier substrate 10; (S2) forming a second polyimide resin layer 30 on the first polyimide resin layer 20 to produce a laminate; and (S3 and S4) applying a physical stimulus p to the laminate without causing chemical changes in the first polyimide resin layer, and separating the second polyimide resin layer 30 from the first polyimide resin layer 20 formed on the carrier substrate 10. The curing process for forming the first polyimide resin layer is conducted at a temperature equal to or 0 to 200° C. lower than the curing temperature of the second polyimide resin. The second polyimide resin layer may be separated by a general method used in the art. For example, a suction method may be used to separate the flexible substrate but the present invention is not limited thereto. Any method may be selected that requires a much smaller force than conventional methods to minimize damage to a display device during fabrication.

The steps prior to the step of separating the second polyimide resin layer 30 in the method for producing the device substrate may be the same as those of the method for producing the laminate.

The second polyimide resin layer 30 may be separated by applying a suitable physical stimulus such as cutting, laser cutting or diamond scribing. Specifically, a physical stimulus not greater than 0.1 N may be applied to separate the second polyimide resin.

The device substrate produced by the method includes the second polyimide resin layer separated from the carrier substrate by the application of a relatively small physical stimulus such as cutting even without the need for further processing such as laser or light irradiation. Accordingly, the use of device substrate can prevent a device from deterioration of reliability or occurrence of defects caused by laser or light irradiation. This ensures improved characteristics of the device.

A further embodiment of the present invention provides a device including the device substrate.

Specifically, the device may be a flexible display device such as a solar cell having the second polyimide resin layer (for example, a flexible solar cell), an organic light emitting diode (OLED) lighting device (for example, a flexible OLED lighting device), a semiconductor device having the second polyimide resin layer, an organic electroluminescent device, an electrophoresis device, or an LCD device. An organic electroluminescent device is particularly preferred.

As illustrated in FIG. 3b, the device may be fabricated by a method including the following steps: sequentially forming a first polyimide resin layer 20 and a second polyimide resin layer 30 on at least one surface of a carrier substrate 10 to obtain a laminate; forming a device structure 40 on the second polyimide resin layer the laminate (i.e. the step of fabricating a device); and applying a physical stimulus p without laser or light irradiation to separate the second polyimide resin layer 30 on which the device structure 40 is formed.

The device structure may vary depending on the kind of the device to be fabricated on the second polyimide resin layer. The device structure may be a general one, for example, a semiconductor device structure including a gate electrode, a display device structure including a thin film transistor array, a diode device structure having a P/N junction, an OLED structure including an organic light emitting layer, or a solar cell structure. As an example, the device structure may be an organic electroluminescent device structure including: a transparent electrode disposed at the back side of the second polyimide resin layer and including, for example, indium tin oxide (ITO); a light emitting part disposed at the back side of the transparent electrode and including, for example, an organic compound; and a metal electrode disposed at the back side of the light emitting part and including, for example, a metal.

As described above, the device of the present invention includes, as a substrate, the second polyimide resin layer separated from the carrier substrate by the application of a physical stimulus without the need for further processing such as laser or light irradiation. The use of the second polyimide resin layer as a flexible substrate can ensure improved characteristics of the device and can make the device highly reliable.

The invention may, however, be embodied in many different forms and should not be construed as being limited to the embodiments set forth herein.

Example 1: Production of Laminate 1 mol of BPDA was polymerized with 0.99 mol of PDA to prepare a polyamic acid resin. A composition including 3 wt % of the polyamic acid resin and 97 wt % of DMAc as a solvent was applied to one surface of non-alkali glass as a carrier substrate such that the thickness after drying was 0.1 μm. The resulting coating was continuously dried at a temperature of 120° C. and cured at a temperature of 250° C. (for 30 min) to form the first polyimide resin layer including a polyimide resin (hereinafter, referred to as a 'first polyimide resin').

Subsequently, 1 mol of BPDA was polymerized with 0.99 mol of TFMB to prepare a polyamic acid resin. A composition including 12 wt % of the polyamic acid resin and 88 wt % of DMAc as a solvent was applied to one surface of non-alkali glass as a carrier substrate such that the thickness after drying was 15 μm. The resulting coating was continuously dried at a temperature of 100° C. and cured at a temperature of 350° C. for 60 min to form a second polyimide resin layer including a polyimide resin (hereinafter, referred to as a 'second polyimide resin'). The resulting laminate (test laminate 1-1) had a structure in which the carrier substrate, the first polyimide resin layer including the BPDA-PDA polyimide resin, and the second polyimide resin layer including the BPDA-TFMB polyimide resin were sequentially disposed.

Production of Test Laminates

Test laminates were produced in the same manner as in Example 1, except that the kinds of the first polyimide resin and the second polyimide resin of the flexible substrate were changed as shown in Table 3.

TABLE 3

| Test laminate No. | First polyimide resin | Second polyimide resin |
|---|---|---|
| 1-1 | BPDA-PDA | BPDA-TFMB |
| 1-2 | BPDA-PDA | BPDA-mPDA |
| 1-3 | BPDA-TFMB | BPDA-TFMB |
| 1-4 | BPDA-TFMB | BPDA-mPDA |
| 1-5 (Comparative) | PMDA-ODA | BPDA-TFMB |

In Table 3, BPDA represents biphenyl-tetracarboxylic dianhydride, PDA represents p-phenylenediamine, TFMB represents 2,2'-bis(trifluoromethyl)benzidine, mPDA represents m-phenylenediamine, PMDA represents pyromellitic dianhydride, and ODA represents 4,4'-oxydianiline.

Test Example 1: Evaluation of Physical Properties of the First Polyimide Resin Layers The first polyimide resin layers of the test laminates were measured for density, coefficient of thermal expansion (CTE), glass transition temperature (Tg), adhesive strength, and peel strength.

Specifically, the adhesive strength was determined by measuring the force required to peel the second polyimide resin layer of each laminate from the first polyimide resin layer using a tape without the application of a physical stimulus (without cutting). The peel strength was determined by cutting each laminate into a rectangular shape having a width of 10 mm and a length of 100 mm and measuring the force required when the ends of the second polyimide resin layer were peeled at a rate of 50 mm/min, using a texture analyzer (TA.XT plus, Stable micro systems). The results are shown in Table 4.

TABLE 4

| Test laminate No. | First polyimide resin (Curing temp.: 250° C.) | Second polyimide resin (Curing temp.: 350° C.) | Physical properties of first polyimide resin | | | Second polyimide resin | Adhesive strength (N/cm) | Peel strength (N/cm) |
|---|---|---|---|---|---|---|---|---|
| | | | Density (g/cm3) | CTE (ppm/° C.) | Tg (° C.) | CTE (ppm/° C.) | | |
| 1-1 | BPDA-PDA | BPDA-TFMB | 1.488 | 3.590 | 374 | 8.205 | 3.64 | 0.022 |
| 1-2 | BPDA-PDA | BPDA-mPDA | 1.488 | 3.590 | 374 | 29.61 | 3.59 | 0.029 |
| 1-3 | BPDA-TFMB | BPDA-TFMB | 1.475 | 8.205 | 352 | 8.205 | 3.61 | 0.132 |
| 1-4 | BPDA-TFMB | BPDA-mPDA | 1.475 | 8.205 | 352 | 29.61 | 3.82 | 0.167 |
| 1-5 (Comparative) | PMDA-ODA | BPDA-TFMB | — | 20.3 | 330 | 8.205 | 3.77 | 1.02 |

In the table, "-" means "not measured".

From the results in Table 4, the test laminates 1-1 to 1-4, each of which included the first polyimide resin layer including the polyimide prepared using the tetracarboxylic dianhydride of Formula 1 and the diamine compound having a linear structure, showed much lower peel strengths than the test laminate 1-5 including the polyimide prepared using the tetracarboxylic dianhydride in which the aromatic rings are connected through a linking group.

On the other hand, despite the absence of a linker structure between the aromatic rings, the test laminates 1-3 and 1-4 showed higher peel strengths than the test laminates 1-1 and 1-2. The reason for the higher peel strength of each of the test laminates 1-3 and 1-4 is because the trifluoromethyl group lowered the packing density of the first polyimide resin layer, resulting in higher adhesive strength between the first polyimide resin layer and the second polyimide resin layer. However, the test laminates 1-3 and 1-4 showed much lower peel strengths than the test laminate 1-5 using the diamine including a linker structure between the aromatic rings.

Changes in the dimension of the test laminates 1-1 and 1-5 with varying temperatures were observed, and the results are shown in FIG. 4. As can be seen from FIG. 4, the test laminate 1-5 underwent a sharp dimensional change at around 350° C., unlike the test laminate 1-1.

Test Example 2: Evaluation of Adhesive Strength and Peel Strength Depending on Curing Temperature Laminates were produced in the same manner as in Example 1, except that the first polyimide resin layers were formed by curing at various temperatures shown in Table 5.

The adhesive strengths and peel strengths of the second polyimide resin layer depending on the curing temperatures for the formation of the first polyimide resin layer of the laminates were measured by the same methods as described in Test Example 1.

After storage of the laminates at 25° C./RH 55% for 1 day, changes in adhesive strength before the application of a physical stimulus were observed and changes in peel strength after cutting was performed as a physical stimulus were observed. The results are shown in Table 5.

TABLE 5

| Day | Curing temperature (° C.) | Adhesive strength (N/cm) | Peel strength (N/cm) |
|---|---|---|---|
| 0 day (immediately after production) | 200 | 3.4 | 0.24 |
| | 250 | 3.64 | 0.022 |
| | 300 | 3.68 | 0.032 |
| 1 day (after storage at 25° C./RH 55%) | 200 | 3.76 | 0.24 |
| | 250 | 3.63 | 0.024 |
| | 300 | 3.62 | 0.036 |

As shown in the above table, the application of the physical stimulus led to a marked decrease in peel strength. This decrease was more pronounced above a predetermined curing temperature (250° C.).

The adhesive strengths and peel strengths were observed for the laminate of Example 1 having undergone curing at 250° C. immediately after production and after storage at 25° C./RH 55% for 7 days. The results are shown in Table 6.

TABLE 6

| Day | Adhesive strength (N/cm) | Peel strength (N/cm) |
|---|---|---|
| 0 day | 3.64 | 0.022 |
| 7 days | 3.66 | 0.020 |

As shown in the above table, the application of the physical stimulus led to a decrease in peel strength. The adhesive strength increased with time. The peel strength decreased with time but its decrease was not significant.

Test Example 3: Evaluation of Peel Strength Depending on the Thickness of the Second Polyimide Resin Test laminates were produced in the same manner as in Example 1, except that the kind of the first and second polyimide resins and the thickness of the second polyimide resin layer were changed as shown in Table 7.

TABLE 7

| | Debonding layer | | Flexible substrate | | |
|---|---|---|---|---|---|
| Test laminate No. | First polyimide resin | Curing temperature | Second polyimide resin | Curing temperature | Thickness (μm) |
| 3-1 | BPDA-PDA | 250° C. | BPDA-TFMB | 350° C. | 19.7 |
| 3-2 | | | | | 5.2 |

TABLE 7-continued

| | Debonding layer | | Flexible substrate | | |
|---|---|---|---|---|---|
| Test laminate No. | First polyimide resin | Curing temperature | Second polyimide resin | Curing temperature | Thickness (μm) |
| 3-3 | | | | | 2.5 |
| 3-4 | | | | | 1.7 |
| 3-5 | | | | | 0.9 |
| 3-6 | | | BPDA-PDA | 450° C. | 19 |
| 3-7 | | | | | 5.3 |
| 3-8 | | | | | 2.1 |
| 3-9 | | | | | 1.4 |

Peel strengths were measured on the test laminates by the same method as described in Test Example 1. The results are shown in Table 8 and FIG. 5.

In Table 8, BPDA-TFMB as the second polyimide resin for the flexible substrates is a transparent polyimide resin and BPDA-PDA as the second polyimide resin for the flexible substrates is a colored polyimide resin.

TABLE 8

| Test laminate No. | Second polyimide resin for flexible substrates | Thickness of flexible substrate (pm) | Adhesive strength (N/cm) | Peel strength (N/cm) |
|---|---|---|---|---|
| 3-1 | BPDA-TFMB | 19.7 | 3.88 | 0.04 |
| 3-2 | | 5.2 | 3.86 | 0.056 |
| 3-3 | | 2.5 | 3.52 | 0.08 |
| 3-4 | | 1.7 | 3.77 | 0.104 |
| 3-5 | | 0.9 | 3.64 | 0.136 |
| 3-6 | BPDA-PDA | 19 | 3.59 | 0.072 |
| 3-7 | | 5.3 | 3.67 | 0.1 |
| 3-8 | | 2.1 | 3.71 | 0.348 |
| 3-9 | | 1.4 | 3.66 | 0.428 |

As can be seen from the test results, as the thickness of each the second polyimide resin layer decreased, the peel strength increased. The test laminates including colored BPDA-PDA as the second polyimide resin underwent significant changes in peel strength depending on the thickness of the second polyimide resin compared to the test laminates including transparent BPDA-TFMB as the second polyimide resin.

Test Example 4: Evaluation of Peel Strength of the First Polyimide Resin Layers Depending on Curing Conditions Test laminates were produced in the same manner as in Example 1, except that the curing temperature and time for the formation of the first polyimide resin layer were changed as shown in Table 9.

The test laminates 4-1 to 4-10 were measured for peel strength by the same methods as described in Test Example 1. The results are shown in Table 9.

TABLE 9

| Test laminate No. | Debonding layer | | | Flexible substrate | | Adhesive strength (N/cm) | Peel strength (N/cm) |
|---|---|---|---|---|---|---|---|
| | First polyimide resin | Curing temp. (° C.) | Curing time (min) | Second polyimide resin | Curing temp. (° C) | | |
| 4-1 | BPDA-PDA | 230 | 3 | BPDA-TFMB | 350 | 3.56 | 0.464 |
| 4-2 | | | 5 | | | 3.61 | 0.084 |
| 4-3 | | | 10 | | | 3.44 | 0.028 |
| 4-4 | | | 20 | | | 3.58 | 0.03 |
| 4-5 | | | 30 | | | 3.72 | 0.026 |
| 4-6 | | 250 | 3 | | | 3.66 | 0.026 |
| 4-7 | | | 5 | | | 3.61 | 0.0296 |
| 4-8 | | | 10 | | | 3.45 | 0.0232 |
| 4-9 | | | 20 | | | 3.58 | 0.0224 |
| 4-10 | | | 30 | | | 3.64 | 0.022 |
| Comparative laminate | — | — | — | BPDA-TFMB | 350 | 3.42 | 0.524 |

As can be seen from the test results, the laminate having undergone curing at the relatively low temperature for a short time showed peel strengths higher than the laminate using no first polyimide resin but the laminates having undergone for a longer time showed lower peel strengths than the laminate using no first polyimide resin. The laminates having undergone curing at the relatively high temperature showed no substantial difference in peel strength depending on the curing time. The laminates having undergone curing at the relatively high temperature for a short time showed low peel strengths.

Test Example 5: Evaluation of Peel Strength Depending on the Kind of the First Polyimide Resin Test laminates were produced in the same manner as in Example 1, except that the kind of the first polyimide resin for the formation of the debonding layer and the kind of the second polyimide resin for the formation of the flexible substrate were changed as shown in Table 10.

TABLE 10

| Test laminate No. | Debonding layer Curing conditions: 250° C., 30 min | | Flexible substrate Curing conditions: 350° C., 60 min | |
|---|---|---|---|---|
| | First polyimide resin | CTE (ppm/° C.) | Second polyimide resin | CTE (ppm/° C.) |
| 5-1 | BPDA-PDA | 3.590 | BPDA-TFMB | 8.205 |
| 5-2 | BPDA-BZD | 4.116 | | |
| 5-3 | BPDA-mTOL | 4.357 | | |
| 5-4 (Comparative) | ODPA-TFMB | 28.09 | | |

In the above table, BZD and mTOL represent benzidine and m-tolidine, respectively.

The test laminates were measured for adhesive strength and peel strength by the same methods as described in Test Example 1. The results are shown in Table 11.

TABLE 11

| Test laminate No. | First polyimide resin for debonding layer | Second polyimide resin for flexible substrate | Adhesive strength (N/cm) | Peel strength (N/cm) |
|---|---|---|---|---|
| 5-1 | BPDA-PDA | BPDA-TFMB | 3.64 | 0.022 |
| 5-2 | BPDA-BZD | | 3.66 | 0.0672 |
| 5-3 | BPDA-mTOL | | 3.48 | 0.068 |
| 5-4 (Comparative) | ODPA-TFMB | | 3.52 | 1.23 |

The reason why the test laminate 5-4 had a very higher peel strength than the other test laminates is believed to be because the diamine for the first polyimide resin of the debonding layer includes a linker structure between the aromatic rings. The presence of the linker structure leads to a low packing density and an increase in intermolecular space. Therefore, the interpenetration of the molecules is facilitated, resulting in high bonding strength.

The measured peel strength values obtained when BPDA-TFMB was used as the second polyimide resin for the flexible substrate were compared with the similarity scores calculated by Equation 1. The results are shown in Table 12.

TABLE 12

| First polyimide resin | Peel strength value (N/cm) | Evaluation | MC-based similarity score |
|---|---|---|---|
| BPDA-PDA | 0.022 | A | 0.3206 |
| BPDA-BZD | 0.0672 | A | 0.1675 |
| BPDA-mTOL | 0.068 | A | 0.1917 |
| BPDA-TFMB | 0.132 | A | 0.4291 |
| PMDA-PDA | 0.052 | A | 0.2992 |
| BPDA-mPDA | Impossible to peel | NA | 0.5069 |
| PMDA-ODA | 1.02 | NA | 0.6598 |
| ODPA-TFMB | 1.23 | NA | 0.5552 |

A: Accepted, NA: not accepted

As can be seen from the results in Table 12, preferred peel strengths were obtained when the similarity score was not greater than 0.5.

Test laminates were produced in the same manner as in Example 1, except that heat treatment was performed on a hot plate at 300° C. for 30 min after curing of the debonding layer. The curing and heat treatment conditions are shown in Table 13. For the test laminates 5-5, 5-6 and 5-7, the heat treatment was repeated 1, 3, and 5 times, respectively.

TABLE 13

| Test laminate No. | Debonding layer | | Flexible substrate | | Number of heat treatments after curing |
|---|---|---|---|---|---|
| | First polyimide resin | Curing conditions | Second polyimide resin | Curing conditions | |
| 5-5 | BPDA-PDA | 250° C., 30 min | BPDA-TFMB | 350° C., 60 min | 1 |
| 5-6 | " | " | " | " | 3 |
| 5-7 | " | " | " | " | 5 |

Changes in peel strength according to the number of heat treatments after curing of the first polyimide resin layers were observed on the test laminates. The peel strengths were measured by the same method as described in Test Example 1. The results are shown in Table 14 and FIG. 6.

TABLE 14

| Test laminate No. | Number of heat treatments | Adhesive strength (N/cm) | Peel strength (N/cm) |
|---|---|---|---|
| 5-5 | 1 | 3.75 | 0.0210 |
| 5-6 | 3 | 3.63 | 0.0210 |
| 5-7 | 5 | 3.81 | 0.0203 |

As shown in the above table, there were no significant changes in peel strength despite the increased number of heat treatments after formation of the first polyimide resin layers.

Test Example 6: Evaluation of Physical Properties of Polyimide Resins

Polyimide resins usable for the formation of debonding layers and polymer layers of flexible substrates in the present invention were evaluated for physical properties.

The tetracarboxylic dianhydride and the diamine compounds shown in Table 15 were prepared. 1 mol of the tetracarboxylic dianhydride was polymerized with 0.99 mol of one of the diamine compounds to prepare a polyamic acid resin. A composition including 12 wt % of the polyamic acid resin and 88 wt % of DMAc as a solvent was applied to one surface of non-alkali glass as a carrier substrate such that the thickness after drying was 10-15 μm. The resulting coating was continuously dried at a temperature of 120° C. and cured at a temperature of 350° C. to form a polyimide resin layer.

The imidization degree and glass transition temperature (Tg) of the polyimide resin of the polyimide resin layer were measured. The coefficient of thermal expansion (CTE) and 1% thermal decomposition temperature (Td1%) of the polyimide resin layer including the polyimide resin were measured.

Specifically, the imidization degree was measured by the following procedure. First, the composition including the polyamic acid resin prepared by polymerization of the monomers shown in Table 15 was applied. Then, the composition was subjected to imidization at temperatures of 200° C. or above and 500° C. or above. The imidization degree was defined as the percentage of the integrated intensity of the CN bands observed at 1350 to 1400 cm-1 or 1550 to 1650 cm-1 in the IR spectrum after imidization of the composition at a temperature of 200° C. or above with respect to the integrated intensity (100%) of the CN bands observed in the same wavelength range after imidization of the composition at a temperature of 500° C. or above.

The glass transition temperature was measured using a differential scanning calorimeter (DSC 2010, TA instrument) while heating at a rate of 10° C./min The 1% thermal decomposition temperature (Td1%) was determined by measuring the temperature at which the initial weight of the polyimide film was reduced by 1% while heating at a rate of 10° C./min under a nitrogen atmosphere, using a thermogravimetric analyzer (TG-DTA2000).

The coefficient of thermal expansion (CTE) was determined as an average of the coefficients of linear thermal expansion of the polyimide film as a test piece growing at a load 5 g/film thickness 15 μm and a rate of 5° C./min in the temperature range of 100-200° C. The coefficients of linear thermal expansion were measured using a thermomechanical analyzer (TMA4000). The results are shown in Table 15.

TABLE 15

| Polyimide resin | Imidization degree | CTE (ppm/° C.) | Tg (° C.) | Td1% (° C.) |
|---|---|---|---|---|
| BPDA-PDA | 95.7 | 3.590 | 374 | 547 |
| BPDA-TFMB | 96.2 | 8.205 | 352 | 524 |

Test Example 7: Changes in Peel Strength Depending on Curing Temperature

Test laminates were produced in the same manner as in Example 1, except that PMDA-PDA was used as the first polyimide resin for debonding layers, BPDA-PDA was used as the second polyimide resin for flexible substrates, and the curing temperature was changed as shown in Table 16. The test laminates were measured for adhesive strength and peel strength. The results are shown in Table 16.

TABLE 16

| Test laminate No. | Curing temperature (° C.) of first polyimide resin (PMDA-PDA) for debonding layer | Curing temperature (° C.) of second polyimide resin (BPDA-PDA) for flexible substrate | Adhesive strength (N/cm) | Peel strength (N/cm) |
|---|---|---|---|---|
| 7-1 | 300 | 450 | 3.61 | 0.09095 |
| 7-2 | 350 | 450 | 3.55 | 0.0802 |
| 7-3 | 400 | 450 | 3.54 | 0.0883 |

Test Example 8: Evaluation of Peel Strength Depending on Copolymerization Molar Ratio for the Preparation of Polyimide for the Formation of Debonding Layer Test laminates were produced in the same manner as in Example 1, except that BPDA and PMDA were used as acid dianhydrides in different molar ratios for the formation of debonding layers. The second polyimide for the formation of flexible substrates was prepared using cyclohexane tetracarboxylic dianhydride (BPDA_H) as an acid dianhydride and 4-amino-N-(4-aminophenyl)benzamide (DABA) and 4,4'-diaminodiphenyl ether (ODA) as diamine compounds in a molar ratio of 9:1. The test laminates were measured for adhesive strength and peel strength. The results are shown in Table 17.

TABLE 17

| Test laminate No. | First polyimide resin for debonding layer (curing temperature: 300° C.) | CTE (ppm/° C.) | Second polyimide resin for flexible substrate (curing temperature: 350° C.) | CTE (ppm/° C.) | Adhesive strength (N/cm) | Peel strength (N/cm) |
|---|---|---|---|---|---|---|
| 8-1 | BPDA7-PMDA3-PDA | 3.280 | BPDA_H-DABA-ODA | 52.82 | 3.59 | 0.134 |
| 8-2 | BPDA5-PMDA5-PDA | 2.771 | | | 3.64 | 0.097 |
| 8-3 | BPDA3-PMDA7-PDA | 2.335 | | | 3.66 | 0.064 |

Test Example 9: Evaluation of Peel Strength Depending on the Kind of Flexible Substrate Two debonding layers were formed in the same manner as in Test Example 8. A polyimide for the formation of a flexible substrate was prepared by reacting cyclohexane tetracarboxylic dianhydride (BPDA_H) as an acid dianhydride with 4-amino-N-(4-aminophenyl)benzamide (DABA) and m-phenylenediamine (mPDA) as diamine compounds in a molar ratio of 9:1. One of the debonding layers and the flexible substrate were used to produce a laminate 9-1. A polyimide for the formation of a flexible substrate was prepared by reacting 4,4'-(hexafluoroisopropylidene)diphthalic dianhydride (6FDA) and pyromellitic dianhydride (PMDA) as acid dianhydrides in a molar ratio of 1:1 with para-phenylenediamine (PDA). The other debonding layer and the flexible substrate were used to produce a laminate 9-2. The laminates were measured for adhesive strength and peel strength. The results are shown in Table 18.

TABLE 18

| Test laminate No. | First polyimide resin for debonding layer (curing temperature: 300° C.) | CTE (ppm/° C.) | Second polyimide resin for flexible substrate (curing temperature: 350° C.) | CTE (ppm/° C.) | Adhesive strength (N/cm) | Peel strength (N/cm) |
|---|---|---|---|---|---|---|
| 9-1 | BPDA3-PMDA7-PDA | 2.335 | BPDA_H-DABA-mPDA | 44.96 | 3.58 | 0.114 |
| 9-2 | BPDA3-PMDA7-PDA | 2.335 | 6FDA-PMDA-PDA | 3.926 | 3.7 | 0.022 |

Test Example 10: Evaluation of Peel Strength Depending on BPDA Content of Debonding Layer Test laminates were produced to have the compositions shown in Table 19. The adhesive strengths and peel strengths of the debonding layers were evaluated. It was confirmed that the debonding layers showed lower peel strengths with increasing PMDA content.

TABLE 19

| Test laminate No. | First polyimide resin for debonding layer (curing temperature: 300° C.) | CTE (ppm/° C.) | Second polyimide resin for flexible substrate (curing temperature: 350° C.) | CTE (ppm/° C.) | Adhesive strength (N/cm) | Peel strength (N/cm) |
|---|---|---|---|---|---|---|
| 10-1 | BPDA3-PMDA7-PDA | 2.335 | BPDA_H-DABA-mPDA | 44.96 | 3.58 | 0.114 |
| 10-2 | BPDA2-PMDA8-PDA | 1.920 | | | 3.66 | 0.092 |
| 10-3 | BPDA1-PMDA9-PDA | 1.581 | | | 3.56 | 0.074 |
| 10-4 | PMDA-PDA | 1.348 | | | 3.64 | 0.052 |
| 10-5 (Comparative) | — | — | | | 3.55 | 0.737 |

While specific embodiments of the invention have been described in detail, it will be appreciated by those skilled in the art that such detailed descriptions are merely preferred embodiments and the scope of the present invention is not limited thereto. Therefore, the true scope of the present invention should be defined by the appended claims and their equivalents.

EXPLANATION OF REFERENCE NUMERALS 10 carrier substrates
20 first polyimide resin layer
30 second polyimide resin layer
40 device structure
100 laminate

The invention claimed is:

1. A laminate for cutting and peeling comprising:
a carrier substrate;
a first polyimide film disposed directly on top of at least one surface of the carrier substrate; and
a second polyimide film disposed on the first polyimide film,
wherein the first polyimide film has a coefficient of thermal expansion (CTE) equal to or lower than the CTE of the second polyimide film at a temperature of 100 to 200° C., and
wherein the adhesive strength of the first polyimide film to the second polyimide film decreases when the second polyimide film in laminate is cut to expose cross-sectional surfaces of the second polyimide film, and
wherein the second polyimide film is adapted to be peeled from the first polyimide film.

2. The laminate according to claim 1, wherein the difference between the coefficients of thermal expansion (CTE) at a temperature of 100 to 200° C. of the first and second polyimide films is 60 ppm/° C. or less.

3. The laminate according to claim 1, wherein the first polyimide film has an adhesive strength of at least 1 N/cm to the second polyimide film before the laminate is cut, and has a peel strength not greater than 0.3 N/cm from the second polyimide film after the laminate is cut.

4. The laminate according to claim 1, wherein the first polyimide film comprises a first polyimide resin that has a similarity score not greater than 0.5, as calculated by Equation 1:

$$\text{Similarity score} = \alpha_{FIT}(k_1 \times Ls_{dianhydride,i} + k_2 \times Ls_{diamine,j})_0^k \quad \text{[Equation 1]}$$

where $$Ls_{dianhydride,i} = \text{Exp}[-k_3 \times \text{Coeff}_i] \times V_i^{y_0}$$

$$Ls_{diamine,j} = \text{Exp}[-k_4 \times \text{Coeff}_j] \times V_j^{y_0}$$

$k_0 = 2.00$,
$y_0 = -1.00$,
$k_1 = 206.67$,
$k_2 = 124.78$,
$k_3 = 3.20$,
$k_4 = 5.90$,
$\text{Coeff}_i$ and $\text{Coeff}_j$ are molecular asphericities calculated from the structures of dianhydride i and diamine j as monomers of the polyimide, respectively, using ADRIANA.Code (Molecular Networks GmbH), $V_i$ and $V_j$ are McGowan volumes calculated from the structures of dianhydride i and diamine j as the monomers, respectively, using ADRIANA.Code (Molecular Networks GmbH), and $\alpha_{FIT}$ is 1.0 if $\exp(-4.0 \times |\text{Coeff}_i - \text{Coeff}_j|) + 0.08 < 0.90$ and is a constant from 0.1 to 0.95 if $\exp(-4.0 \times |\text{Coeff}_i - \text{Coeff}_j|) + 0.08 \geq 0.90$.

5. The laminate according to claim 1, wherein the first polyimide film comprises a first polyimide resin that has an imidization degree of 60% to 99% when the imidization degree is defined as the percentage of the integrated intensity of the CN bands observed at 1350 to 1400 cm$^{-1}$ or 1550 to 1650 cm$^{-1}$ in the IR spectrum after a composition comprising a polyamic acid resin is applied and imidized at a temperature of 200° C. or above with respect to the integrated intensity (100%) of the CN bands observed in the same wavelength range after the composition is imidized at a temperature of 500° C. or above.

6. The laminate according to claim 1, wherein the first polyimide film comprises a first polyimide resin that has a glass transition temperature of 200° C. or above.

7. The laminate according to claim 1, wherein the first polyimide film is formed by applying a composition including a polyimide resin or a precursor thereof on the carrier substrate and curing the composition at a temperature equal to or 0 to 200° C. lower than the curing temperature of the second polyimide film.

8. The laminate according to claim 1, wherein the first polyimide film comprises a first polyimide resin prepared by reacting an aromatic tetracarboxylic dianhydride of Formula 1:

[Formula 1]

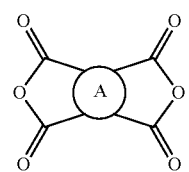

wherein A is a tetravalent aromatic organic group of Formula 2a or 2b:

[Formula 2a]

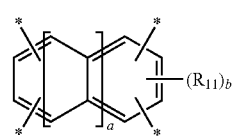

wherein $R_{11}$ is a $C_1$-$C_4$ alkyl or $C_1$-$C_4$ haloalkyl group, a is an integer from 0 to 3, and b is an integer from 0 to 2,

[Formula 2b]

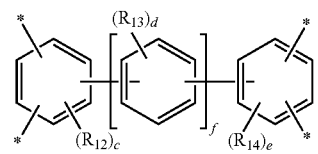

wherein $R_{12}$ to $R_{14}$ are each independently a $C_1$-$C_4$ alkyl or $C_1$-$C_4$ haloalkyl group, c and e are each independently an integer from 0 to 3, d is an integer from 0 to 4, and f is an integer from 0 to 3, with an aromatic diamine compound having a linear structure to prepare a polyamic acid, and curing the polyamic acid at a temperature of 200° C. or above.

9. The laminate according to claim 8, wherein the aromatic diamine compound is represented by Formula 4a or 4b:

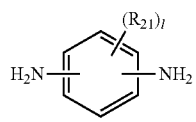

[Formula 4a]

wherein $R_{21}$ is a $C_1$-$C_{10}$ alkyl or $C_1$-$C_{10}$ haloalkyl group and l is an integer from 0 to 4,

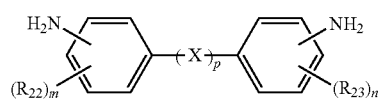

[Formula 4b]

wherein $R_{22}$ and $R_{23}$ are each independently a $C_1$-$C_{10}$ alkyl or $C_1$-$C_{10}$ haloalkyl group, X is selected from the group consisting of —O—, —$CR_{24}R_{25}$—, —C(=O)—, —C(=O)O—, —C(=O)NH—, —S—, —SO—, —$SO_2$—, —O[$CH_2CH_2O$]$_q$—, $C_6$-$C_{18}$ monocyclic and polycyclic cycloalkylene groups, $C_6$-$C_{18}$ monocyclic and polycyclic arylene groups, and combinations thereof, $R_{24}$ and $R_{25}$ are each independently selected from the group consisting of a hydrogen atom, $C_1$-$C_{10}$ alkyl groups, and $C_1$-$C_{10}$ haloalkyl groups, q is an integer of 1 or 2, m and n are each independently an integer from 0 to 4, and p is an integer of 0 or 1.

10. The laminate according to claim 1, wherein the first polyimide film has a coefficient of thermal expansion not higher than 30 ppm/° C. at a temperature of 100 to 200° C. and a 1% thermal decomposition temperature (Td1%) of 450° C. or above.

11. The laminate according to claim 1, wherein the first polyimide film has a thickness of 0.05 to 5 μm.

12. The laminate according to claim 1, wherein the second polyimide film comprises a second polyimide resin having an imidization degree of 50 to 99% and a glass transition temperature of 200° C. or above.

13. A method for producing a laminate of claim 1, comprising:

forming a first polyimide film comprising a first polyimide resin on at least one surface of a carrier substrate; and forming a second polyimide film on the first polyimide film by applying a composition comprising a precursor of the second polyimide resin and curing the composition.

14. The method according to claim 13, wherein the first polyimide film is formed by applying a composition including a first polyimide resin or a precursor thereof on at least one surface of the carrier substrate and curing the composition.

15. The method according to claim 14, wherein the curing process for the first polyimide film is conducted at a temperature of 200° C. or higher, and the curing process for the second polyimide film comprising a second polyimide resin is performed at a temperature equal to or 0 to 200° C. higher than the curing temperature of the first polyimide resin.

16. The method according to claim 14, further comprising a step of heat treating the first or the second polyimide film at a temperature of 300° C. or above for 1 to 30 minutes after the step of forming the first or the second polyimide resin.

17. A method for producing a device substrate, comprising:

applying a physical stimulus to the laminate of claim 1 without causing chemical changes in the first polyimide film layer such that the cross-sections of the second polyimide film are exposed; and separating the second polyimide film from the first polyimide film formed on the carrier substrate.

18. A device substrate produced by the method according to claim 17.

19. A method for producing a device, comprising:

forming the laminate of claim 1;

forming a device structure on the second polyimide film of the laminate;

applying a physical stimulus to the laminate on which the device structure is formed, without causing chemical changes in the first polyimide film such that the cross-sections of the second polyimide film are exposed; and separating the second polyimide film from the first polyimide film formed on the carrier substrate to obtain the device.

20. A device produced by the method according to claim 19.

21. A device according to claim 20, wherein the device is selected from the group consisting of solar cells, organic light emitting diode lighting devices, semiconductor devices, and display devices.

22. The device according to claim 21, wherein the display devices are flexible organic electroluminescent devices.

* * * * *